United States Patent
Kono

(10) Patent No.: US 8,810,297 B2
(45) Date of Patent: Aug. 19, 2014

(54) CIRCUIT DEVICE, FREQUENCY CHANGING CIRCUIT, METHOD OF TESTING CIRCUIT DEVICE, AND METHOD OF CONTROLLING FREQUENCY CHANGING CIRCUIT

(71) Applicant: Fujitsu Limited, Kawasaki (JP)

(72) Inventor: Takeshi Kono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/834,433

(22) Filed: Mar. 15, 2013

(65) Prior Publication Data

US 2013/0200931 A1   Aug. 8, 2013

Related U.S. Application Data

(63) Continuation of application No. PCT/JP2010/066184, filed on Sep. 17, 2010.

(51) Int. Cl.
*H03H 11/16* (2006.01)
*H03K 5/13* (2014.01)

(52) U.S. Cl.
CPC . *H03H 11/16* (2013.01); *H03K 5/13* (2013.01)
USPC ............................. 327/231; 327/241; 327/242

(58) Field of Classification Search
USPC .......................................... 327/145, 235, 236
See application file for complete search history.

(56) References Cited

U.S. PATENT DOCUMENTS 6,127,858 A * 10/2000 Stinson et al. .................. 327/99
7,724,862 B2 * 5/2010 Menolfi et al. ................ 375/376
8,072,253 B2 * 12/2011 Kaeriyama et al. ........... 327/231
2004/0193991 A1   9/2004 Tanaka et al.
2005/0240842 A1  10/2005 Yonaga
2007/0061654 A1   3/2007 Shimosawa
2010/0039157 A1   2/2010 Kaeriyama et al.

FOREIGN PATENT DOCUMENTS

| JP | 2004-212310 | 7/2004 |
| JP | 2005-003628 | 1/2005 |
| JP | 2005-332555 | 12/2005 |
| JP | 2006-064588 | 3/2006 |
| JP | 2007-064648 | 3/2007 |
| WO | WO-2008/032701 | 3/2008 |

OTHER PUBLICATIONS

International Search Report, mailed in connection with PCT/JP2010/066184 and mailed Oct. 26, 2010.

* cited by examiner

*Primary Examiner* — John Poos
(74) *Attorney, Agent, or Firm* — Fujitsu Patent Center

(57) ABSTRACT

A circuit device includes a clock generator outputting a clock signal having a first frequency; plural phase controllers inputting the clock signal having the first frequency, and outputting clock signals having the first frequency and having phases advanced or delayed with respect to a phase of the clock signal; a selector inputting the plural clock signals having the first frequency output from the plural phase controllers, sequentially selecting pulses of the plural clock signals, and outputting a clock signal having a second frequency; a pattern generator generating a test pattern based on the clock signal having the second frequency; and a circuit inputting the clock signal having the second frequency and the test pattern generated by the pattern generator, operate based on the clock signal having the second frequency, and outputting operation results.

14 Claims, 15 Drawing Sheets

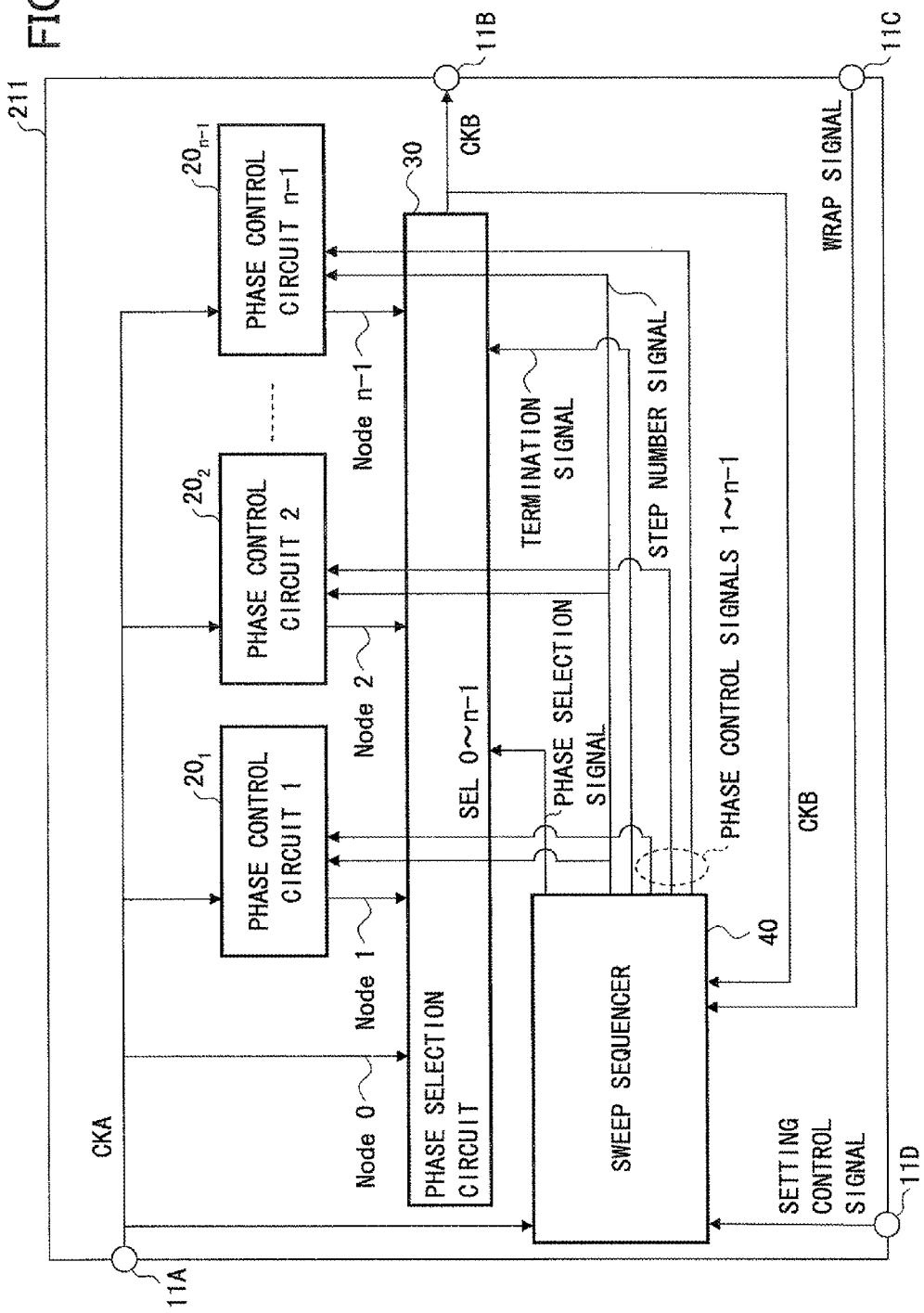

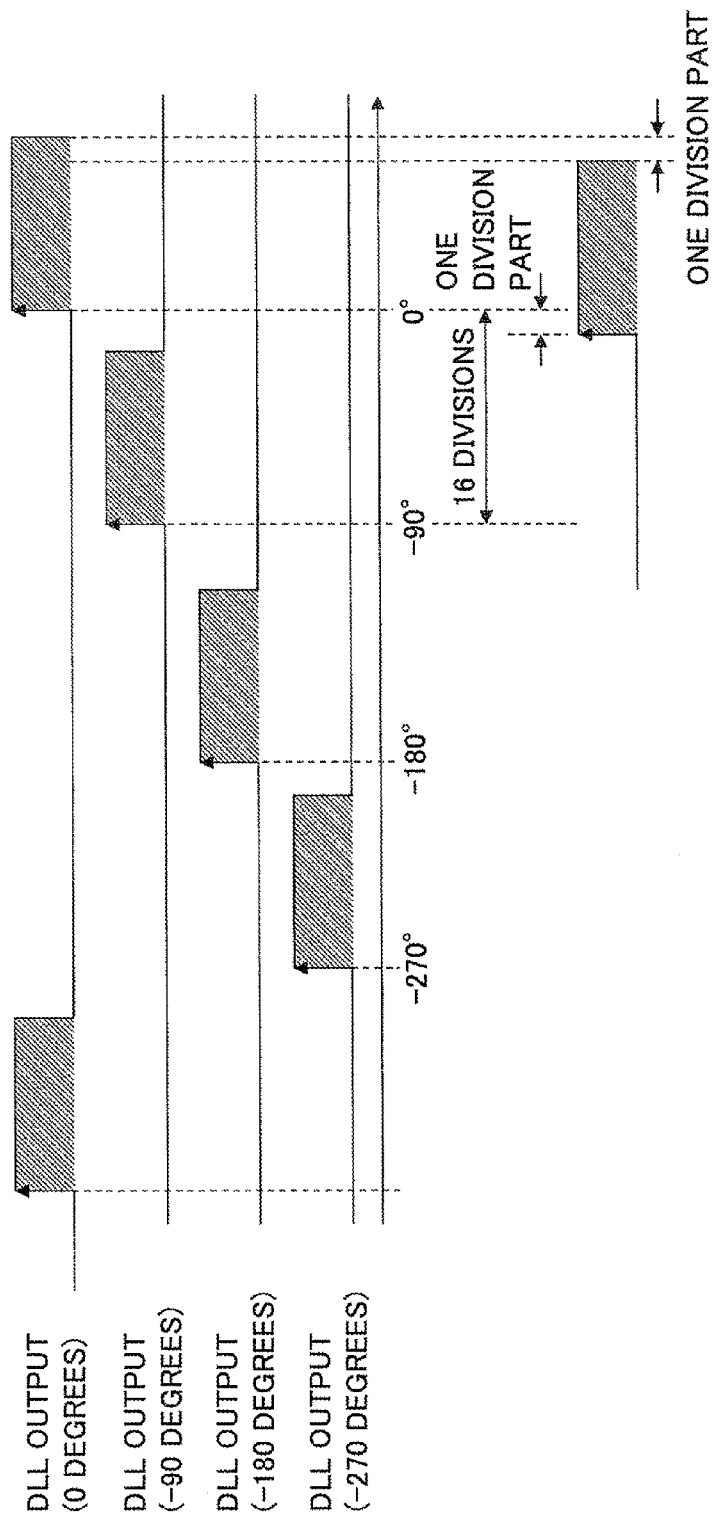

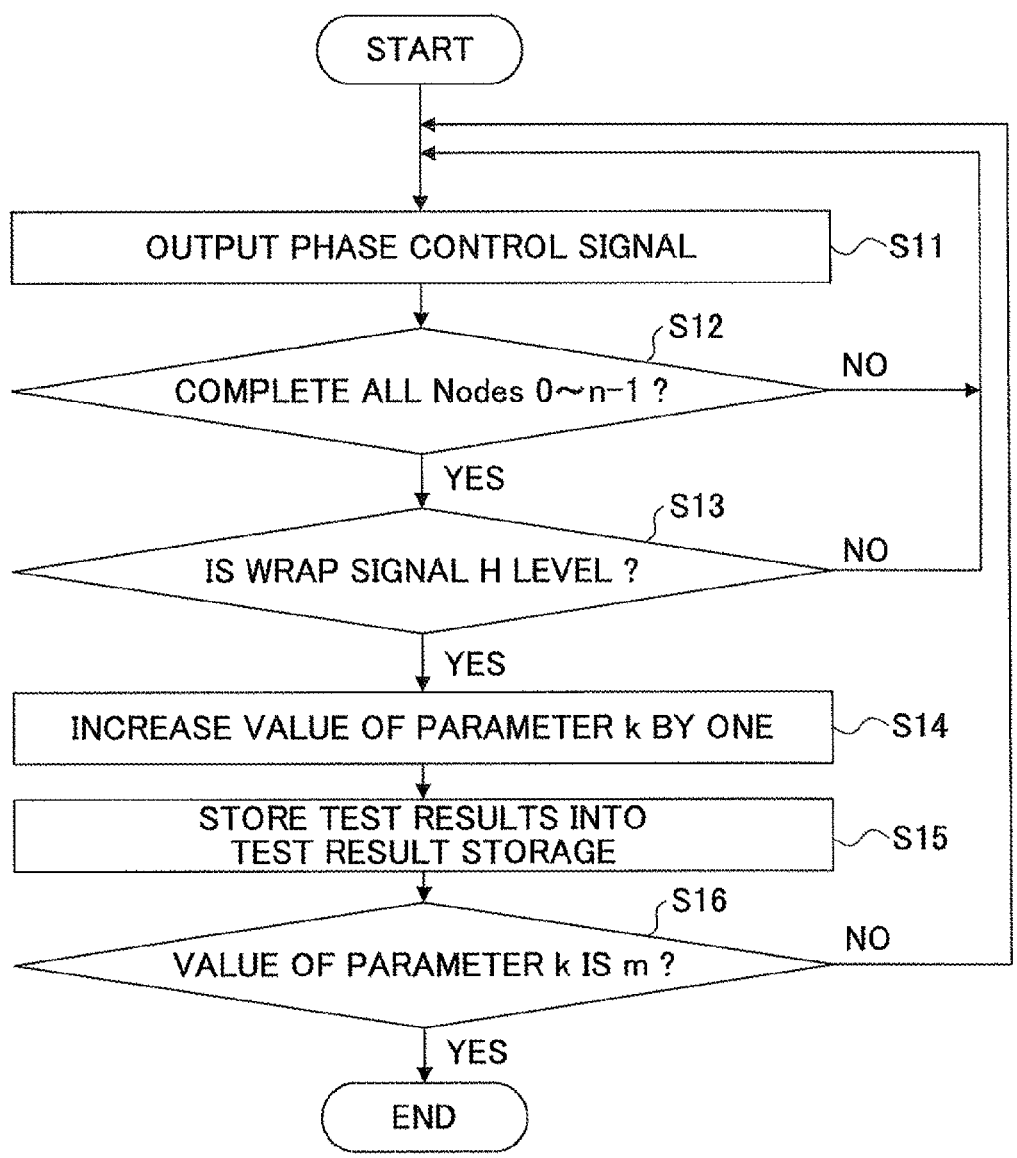

CIRCUIT DEVICE, FREQUENCY CHANGING CIRCUIT, METHOD OF TESTING CIRCUIT DEVICE, AND METHOD OF CONTROLLING FREQUENCY CHANGING CIRCUIT

CROSS-REFERENCE TO RELATED APPLICATION

This application is a continuation application of International Application PCT/JP2010/066184 filed on Sep. 17, 2010 and designated the U.S., the entire contents of which are incorporated herein by reference.

FIELD

The embodiment discussed herein is related to a circuit device, a frequency changing circuit, a method of testing the circuit device, and a method of controlling the frequency changing circuit.

BACKGROUND

There has been known a Built In Self Test (BIST) technique in which a pattern generation circuit and a determination circuit are included in an LSI circuit. The pattern generation circuit generates a predetermined test pattern in accordance with the logic of an LSI circuit. The determination circuit determines whether an LSI is passed or failed base on a result of operating the circuit by inputting a generated pattern to the LSI.

By using the BIST technique, it becomes possible to reduce the testing time in the shipping process of the LSI in a semiconductor manufacturing facility and also reduce the cost of the LSI.

References may be made to Japanese Laid-open Patent Publication Nos. 2004-212310 and 2007-064648.

SUMMARY OF THE INVENTION

According to an aspect of the present application, a circuit device includes a clock generator outputting a clock signal having a first frequency; plural phase controllers inputting the clock signal having the first frequency output by the clock generator, and outputting respective clock signals having the first frequency and having phases that are advanced or delayed with respect to a phase of the clock signal having the first frequency output by the clock generator; a selector inputting plural of the clock signals having the first frequency output from the plural phase controllers, sequentially selecting pulses of the plural clock signals having the first frequency, and outputting a clock signal having a second frequency; a pattern generator generating a test pattern based on the clock signal having the second frequency output from the selector; and a circuit inputting the clock signal having the second frequency output from the selector and the test pattern generated by the pattern generator, operating based on the clock signal having the second frequency, and outputting operation results of the operations when inputting the test pattern based on the clock signal having the second frequency.

The object and advantages of the disclosure will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 6 is a drawing illustrating a cycle sweep circuit 211 of the semiconductor circuit device 200 according to the second embodiment;

FIG. 7B is a timing chart illustrating an operational principle of the semiconductor circuit device 200 according to the second embodiment;

FIG. 9B is a flowchart illustrating a process performed by the sweep sequencer 40 of the semiconductor circuit device 200 according to the second embodiment;

DESCRIPTION OF EMBODIMENT

In the following, a circuit device, a frequency changing circuit, a method of testing the circuit device, and a method of controlling the frequency changing circuit according to embodiments are described.

Before semiconductor circuit devices according first and second embodiment are described, a problem in a semiconductor circuit device according to a comparative example is described with reference to FIG. 1.

Figure 1:
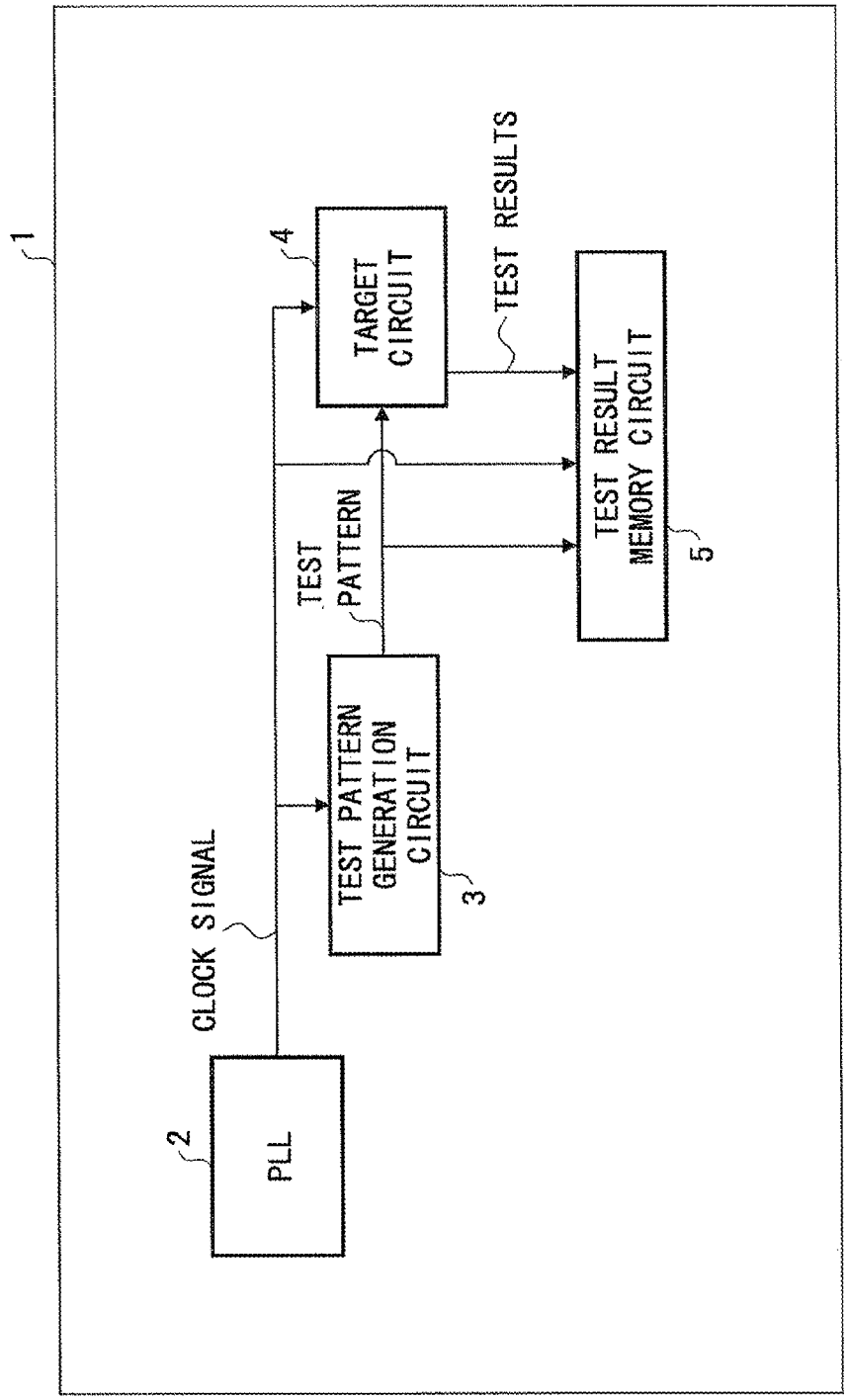
FIG. 1 is a block diagram of a semiconductor circuit device of a comparative example.

FIG. 1 is a block diagram of a semiconductor circuit device according to a comparative example.

The semiconductor circuit device 1 according to the comparative example includes a Phase Locked Loop circuit (PLL) 2, a test pattern generation circuit 3, a target circuit 4, and a test result memory circuit 5.

The semiconductor circuit device 1 herein refers to a Large Scale Integration circuit (LSI), which includes, for example, a Static Random Access Memory (SRAM).

In the semiconductor circuit device 1 of FIG. 1, the test pattern generation circuit 3 and the test result memory circuit 5 may be essential to execute a Built In Self Test (BIST). The target circuit 4 is a type of a circuit which is to be tested. The target circuit 4 is an SRAM.

The PLL 2 outputs a clock signal which is generated by multiplying a frequency of a clock signal input from outside of the semiconductor circuit device 1. Upon receiving the clock signal from a crystal oscillator outside of the semiconductor circuit device 1 during a normal operation (system operation), the PLL 2 outputs a clock signal for the normal operation (system operation). Further, upon receiving a clock signal from an LSI tester during BIST execution, the PLL 2 outputs a clock signal for BIST.

The PLL 2 is connected to the test pattern generation circuit 3, the target circuit 4, and the test result memory circuit 5, and inputs the clock signal for BIST into the test pattern generation circuit 3, the target circuit 4, and the test result memory circuit 5.

Here, the normal operation (system operation) refers to an operation in which, when the semiconductor circuit device 1 is a Static Random Access Memory (SRAM), the semiconductor circuit device 1 is used as the SRAM. Therefore, the clock signal for the normal operation herein refers to a clock signal which is desired for performing the normal operation (system operation).

Further, the clock signal for BIST herein refers to a clock signal desired for executing the BIST of the target circuit 4.

The test pattern generation circuit 3 herein refers to a circuit which generates a test pattern desired for the BIST of the target circuit 4.

Herein, a test pattern includes data to be written into all the bit cells included in the target circuit 4 (write data), data indicating addresses of the bit cells (address data), a Write/Enable (W/E) signal, and data corresponding to expected values and the like. The test pattern is generated by a program register in the test pattern generation circuit 3.

The output terminal of the test pattern generation circuit 3 is connected to the target circuit 4 and the test result memory circuit 5.

The test pattern generation circuit 3 inputs the write data, the address data, and the W/E signal of the test pattern into the target circuit 4, and inputs the expected values into the test result memory circuit 5.

The target circuit 4 herein refers to a circuit to be a test target of the BIST, and may be an SRAM.

The output terminal of the target circuit 4 is connected to the test result memory circuit 5. The target circuit 4 outputs an operation result indicating a result of the operation performed based on the clock signal for BIST and the test pattern.

The test result memory circuit 5 refers to a circuit storing a test result acquired by comparing operation results of the target circuit 4 with the corresponding expected values (BIST test result), and may be a register.

The BIST test result indicates the data which are read from the target circuit 4 after the write data have been written into the target circuit 4, and also results which indicate whether the data read from the target circuit 4 correspond to the expected values (pass/fail result of target circuit 4).

If the data which have been read from all the bit cells in the target circuit correspond to the expected values, the test result is pass (i.e., the target circuit 4 is good). On the other hand, if there are included data indicating that some data read from a bit cell do not correspond to the expected values, the test result is fail (i.e., the target circuit 4 has failed (defective)).

When the BIST is performed on the semiconductor circuit device 1, the semiconductor circuit device 1 is connected to an LSI tester, and a BIST input signal is input into the PLL 2. The PLL 2 outputs the BIST clock signal, and the BIST clock signal is input into the test pattern generation circuit 3, the target circuit 4, and the test result memory circuit 5.

In response to the BIST clock signal input from the PLL 2, the test pattern generation circuit 3 outputs a test pattern based on logic of the target circuit which is a test target. The test pattern output from the test pattern generation circuit 3 is input into the target circuit 4.

The target circuit 4 writes the write data, which are included in the test pattern, based on the BIST clock signal. After completing the writing process, the write data are read from the target circuit 4, the test result memory circuit 5 compares the read data with the corresponding expected values, and stores the data indicating the test results thereof.

Further, the test results stored in the test result memory circuit 5 are scanned out and output to the outside of the test result memory circuit 5.

In the meantime, when it is determined (verify) whether the target circuit 4 has passed or failed, it is desired to change the operation frequency of the target circuit 4 to which the test patterns are applied so as to acquire test results under various operating conditions.

To that end, to verify whether the LSI (under test) such as the semiconductor circuit device 1 has passed or failed, a "Shmoo Plot" may be generally formed (generated).

The Shmoo Plot refers to a plot in which test results are expressed in a matrix manner. In the matrix, parameters related to each other such as power voltage and operation frequency of the target circuit 4 to which the BIST test pattern is applied are expressed in vertical and horizontal axes.

Further, when temperature data of the semiconductor circuit device 1 are also used in addition to the power voltage and the operating frequency of the target circuit 4, the Shmoo Plot may include a third axis (temperature axis) which is orthogonal to the vertical and the horizontal axes.

By using such a Shmoo Plot, it may become possible to recognize a combination of parameters in a range where the LSI operates.

However, in the BIST of the semiconductor circuit device 1 according to a comparative example, in a test in one time, an operation test is performed using a single test pattern (i.e., using one (kind of) power voltage, one (kind of) operation frequency, and one (kind of) temperature).

Therefore, to change any of the power voltage, the operation frequency, and the temperature of the target circuit 4, it may be desired to re-set the power voltage, the operation frequency, or the temperature accordingly.

Therefore, to form the Shmoo Plot by executing the BIST with respect to plural power voltages, plural operation frequencies, and plural temperatures, it may be desired to repeat the BIST while changing the parameters such as the power voltage, the operation frequency and the like of the target circuit 4.

Further, in a case where the BIST is performed by using one test pattern, an additional time period may be necessary to turn on and off to switch the power of the target circuit 4 and to set and read test results of the target circuit 4 by scanning in and scanning out.

Therefore, it may take much time to form the Shmoo Plot while changing parameters in the semiconductor circuit device 1.

Especially, among the parameters, when the operation frequency of the target circuit 4 is changed, it may be desired to change the frequency of the clock signal output from the PLL 2. Then, it may take time to wait until the output frequency of the PLL 2 is stabilized. This is a main reason why vast time may be desired to form the Shmoo Plot while changing parameters.

As described above, in the semiconductor circuit device 1 according to a comparative example, it may take much time to form the Shmoo Plot while changing the operation frequency of the target circuit 4.

Therefore, according to first and second embodiments, there may be provide semiconductor circuit devices in which the above problems are resolved.

In the following, first and second embodiments are described.

First Embodiment

Figure 2:
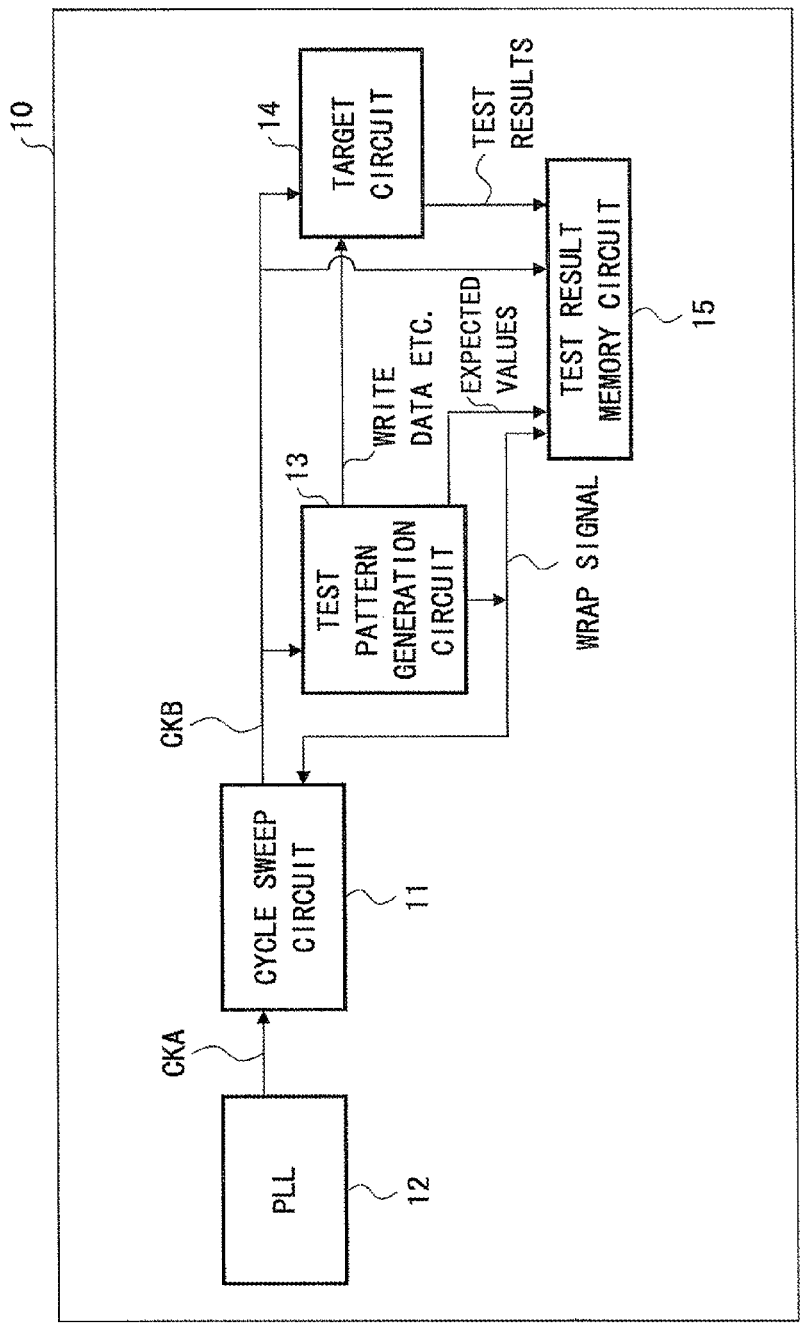
FIG. 2 is a block diagram of a semiconductor circuit device 10 according to a first embodiment.

FIG. 2 is a block diagram of a semiconductor circuit device 10 according to a first embodiment.

The semiconductor circuit device 10 according to the first embodiment includes a cycle sweep circuit 11, a PLL 12, a test pattern generation circuit 13, a target circuit 14, and a test result memory circuit 15.

The PLL 12, the target circuit 14, and the test result memory circuit 15 of FIG. 2 input BIST clock signals which differ from those in the comparative example, but are similar to the PLL 2, the target circuit 4, and the test result memory circuit 5 of FIG. 1, respectively. Therefore, the descriptions of the PLL 12, the target circuit 14, and the test result memory circuit 15 may refer to those of the PLL 2, the target circuit 4, and the test result memory circuit 5 of FIG. 1.

In the first embodiment, as an example of a circuit device, a case is described where the semiconductor circuit device 10 is an LSI. When the semiconductor circuit device 10 is an LSI, it may become possible to achieve faster processing speed, higher performance, reduction of the manufacturing cost, improvement of reliability and the like.

However, the circuit device is not limited to the LSI such as the semiconductor circuit device 10. Namely, at least one of the cycle sweep circuit 11, the PLL 12, the test pattern generation circuit 13, and the test result memory circuit 15 may be provided (formed) by using a discrete part, a Field Programmable Gate array (FPG) or the like.

In the semiconductor circuit device 10 according to the first embodiment, the cycle sweep circuit 11 performs the BIST while changing the frequency of the BIST clock signal (clock signal for BIST), so that the frequency characteristics of the Shmoo plot can be acquired within a single sequential process.

To make it possible to perform such a process, the test pattern generation circuit 13 includes an additional function to those in the test pattern generation circuit 3 of the comparative example. The additional function is described below.

The cycle sweep circuit 11 is provided between the PLL 12 and the test pattern generation circuit 13, the target circuit 14, and the test result memory circuit 15.

The cycle sweep circuit 11 inputs (receives) a BIST clock signal CKA (clock signal CKA for BIST) output from the PLL 12 serving as an example of a clock generator, and may change the frequency of the clock signal CKA.

In the following descriptions, it is assumed that the cycle sweep circuit 11 inputs the clock signal CKA and outputs a clock signal CKB having a frequency having been changed (different) from that of the clock A. The clock signal CKB is a signal having the frequency that has been changed by advancing or delaying the phase of the clock signal CKA.

Here, the levels (degrees) of advancing or delaying the phase of the clock signal CKA may be discretely set (determined). When the phase of the clock signal CKA is advanced, a cycle of the clock signal CKB output from the cycle sweep circuit 11 is shorter and the frequency is higher. On the other hand, when the phase of the clock signal CKA is delayed, a cycle of the clock signal CKB output from the cycle sweep circuit 11 is longer and the frequency is lower.

Further, as the level of advancing or delaying the phase of the clock signal CKA, a value "0" may be set. When "0" is set as the level of advancing or delaying the phase of the clock signal CKA, the clock signal CKB output from the cycle sweep circuit 11 will have the same cycle and frequency of the clock signal CKA to be input into the cycle sweep circuit 11.

Further, in this first embodiment, an example is described where the clock CKB, which is generated by advancing the phase of the clock signal CKA, is used.

The clock signal CKB output from the cycle sweep circuit 11 is input into the test pattern generation circuit 13, the target circuit 14, and the test result memory circuit 15.

The test pattern generation circuit 13 is an example of a pattern generator that outputs a certain kind of test pattern several times (m times (m: any integer greater than one)) based on the BIST clock signal CKB input from the cycle sweep circuit 11. The test pattern output from the test pattern generation circuit 13 is input into the target circuit 14.

Here, the test patterns according to the first embodiment is generated along with the clock signal CSK whose frequency is gradually reduced in the test pattern generation circuit 13. Therefore, the test patterns sequentially generated will include plural (respective) operation frequencies.

Further, as the additional function to those of the test pattern generation circuit 13 according to the comparative example, the test pattern generation circuit 13 further includes a function to output a wrap signal to input (the clock signal CKB) into the test result memory circuit 15. The wrap signal is generated along with the test pattern by a program register in the test pattern generation circuit 13.

In sequentially generating m test patterns, whenever one test pattern is generated and the test pattern is switched to the next test pattern to be generated, the test pattern generation circuit 13 outputs the wrap signal. The wrap signal is set to H level ("1") for a certain time period by the test pattern generation circuit 13 whenever one test pattern is generated and the test pattern is switched to the next test pattern to be generated (i.e., whenever each test pattern is completed). The wrap signal is set to L level ("0") while the test pattern is performed (executed). Details of the wrap signal are described below.

The target circuit 14 is an example of a circuit that performs a process on the test pattern based on the BIST clock signal CKB, and inputs the process results (operation results) into the test result memory circuit 15.

The test result memory circuit 15 compares the process results (operation results) of the target circuit 14 with the corresponding expected values, and stores data indicating the test results (comparison results). The test result memory circuit 15 includes a function as an example of a comparator that compares the process results (operation results) with the corresponding expected values and a function as an example of a comparison result memory circuit that stores the test results (comparison results).

Figure 3:
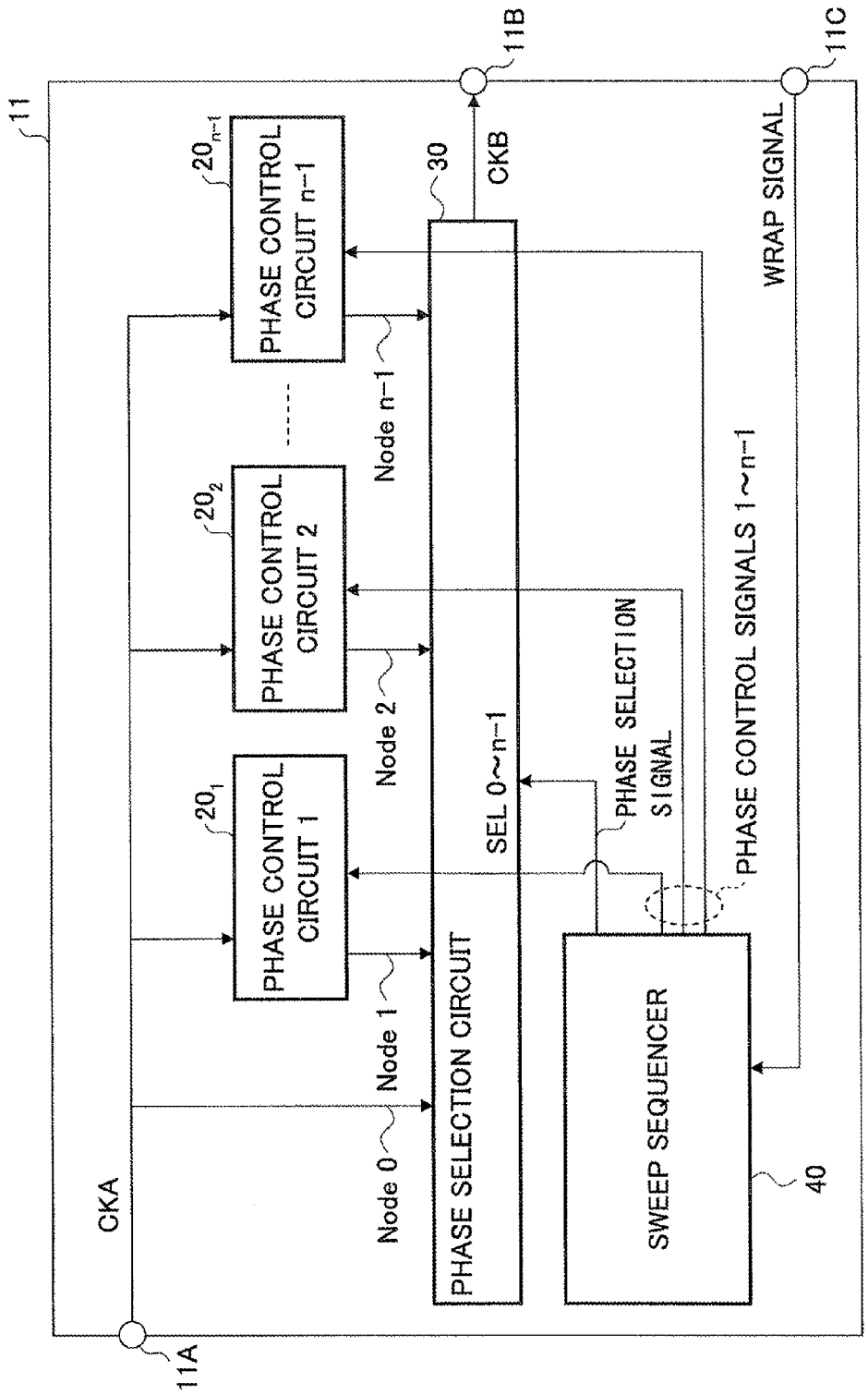
FIG. 3 illustrates a cycle sweep circuit 11 of the semiconductor circuit device 10 according to the first embodiment.

Next, with reference to FIG. 3, the cycle sweep circuit 11 is described.

FIG. 3 illustrates the cycle sweep circuit 11 of the semiconductor circuit device 10 according to the first embodiment.

The cycle sweep circuit 11 includes a clock input terminal 11A, a clock output terminal 11B, a wrap signal input terminal 11C, phase control circuits $20_1, 20_2, \ldots,$ and $20_{n-1}$, a phase selection circuit 30, and a sweep sequencer 40.

There are provided n signal lines branched in parallel between the clock input terminal 11A and the phase selection circuit 30. Herein, symbols Node 0, Node 1, Node 2, ..., and Node n−1 denote the branched n signal lines.

The clock output terminal 11B is connected to the test pattern generation circuit 13, the target circuit 14, and the test result memory circuit 15, so that the clock signal having the frequency having been changed by the cycle sweep circuit 11 is input into the test pattern generation circuit 13, the target circuit 14, and the test result memory circuit 15.

The wrap signal input terminal 11C is connected to the test pattern generation circuit 13 as illustrated in FIG. 2, so that the wrap signal output from the test pattern generation circuit 13 is input into the cycle sweep circuit 11.

The phase control circuits $20_1, 20_2, \ldots,$ and $20_{n-1}$ are connected to the corresponding signal lines of Node 1, Node 2, ..., and Node n−1 between the clock input terminal 11A and the phase selection circuit 30. The signal line of Node 0 is not inserted into any phase controller.

The phase control circuits $20_1, 20_2, \ldots,$ and $20_{n-1}$ are an example of plural phase controllers that reduce one cycle of the clock signal CKA by (1×k) times, (2×k) times, ..., and ((n−1)×k) times of a unit time to advance the phase of the clock signal CKA based on phase control signals 1 through n−1, respectively, which are input from the sweep sequencer 40.

The phase control signals 1 through n−1 input from the sweep sequencer 40 herein refers to control signals that control advancing or delaying (retarding) the phase of the clock signal CKA by the phase control circuits $20_1, 20_2, \ldots,$ and $20_{n-1}$ based on the values "n" and "k".

The phase control signals 1 through n−1 express the time periods which are (1×k) times, (2×k) times, ..., and ((n−1)×k) times, respectively, of a unit time as the reduction levels of one cycle of the clock signal CKA.

Here, n is an integer greater than one and is a fixed value calculated by adding the number (n−1) which corresponds the number of phase control circuits $20_1, 20_2, \ldots,$ and $20_{n-1}$ to one corresponding to Node 0.

Further, the parameter k refers to a parameter that sequentially increases from 0 to m assuming that the maximum value is m−1 (m: an integer greater than one, fixed value).

In the semiconductor circuit device 10 according to the first embodiment, the BIST is performed by sequentially using m test patterns which are test pattern 0 to test pattern m−1. The value of the parameter k denotes the test pattern k which is used in this case.

As described above, the number of the test patterns 0 through m−1 is m. When the value of the parameter k is increased from zero and is equal to m, the BIST using the test patterns 0 through m−1 is completed.

In the semiconductor circuit device 10 according to the first embodiment, while sequentially increasing the value of the parameter k from zero (to m−1), the cycle of the clock signal CKA is sequentially reduced by the phase control circuits $20_1, 20_2, \ldots,$ and $20_{n-1}$. Further, when the value of the parameter k is equal to m, the BIST is completed.

More specifically, the cycle of the clock signal CKA is reduced by using formulas corresponding to (1×k) times, (2×k) times, ..., and ((n−1)×k) times of a unit time in the phase control circuits $20_1, 20_2, \ldots,$ and $20_{n-1}$, respectively, while the value of the parameter k is sequentially increased from zero to (m−1).

Namely, while the value of the parameter k is increased from zero to (m−1), the cycle of the clock signal CKA is repeatedly reduced in the order of (1×0) times, (2×0) times, ..., ((n−1)×0) times, (0×1) times, (1×1) times, (2×1) times, ..., ((n−1)×1) times, (0×(m−1)) times, (1×(m−1)) times, (2×(m−1)) times, ..., and ((n−1)×(m−1)) times of the unit time.

The phase selection circuit 30 is a circuit that generates the clock signal CKB in which the cycle thereof is reduced based on a phase selection signal which is input from the sweep sequencer 40.

The phase selection signal is a signal that sequentially selects H (High) level pulses of the clock signals input to the phase selection circuit 30 via the signal lines of Node 0, Node 1, Node 2, ..., and Node n−1 (when Node 0 is selected) or the clock signals from the phase control circuits 1 through n−1 (when node 1 though n−1 is selected).

Here, when assuming that the numbers of the signal lines of Node 0, Node 1, Node 2, ..., and Node n−1 are the Node numbers, the phase selection signal expresses the Node number of the signal line selected by the phase selection circuit 30.

To sequentially select the clock signal CKA input into the phase selection circuit 30 from the signal lines of Node 0, Node 1, Node 2, ..., and Node n−1 every one cycle, the Node number expressing the phase selection signal sequentially changes every one cycle.

The phase selection circuit 30 generates the clock signal CKB having the reduced cycle by sequentially selecting the H-level pulse of the clock signal CKA every one cycle one by one, the clock signal CKA being input via the signal lines of Node 0, Node 1, Node 2, ..., and Node n−1 based on the phase selection signal. As the phase selection circuit 30, a selector may be used. The phase selection circuit 30 is an example of a selector.

As described above, in the signal lines of Node 1, Node 2, ..., and Node n−1, the phase control circuits $20_1, 20_2, \ldots,$ and $20_{n-1}$ are inserted, respectively, and no phase control circuit is inserted in the signal line of Node 0.

To that end, the phase of the H-level pulse of the clock signal CKA input into the phase selection circuit 30 via the signal lines of Node 0, Node 1, Node 2, ..., and Node n−1 is advanced by zero times, (1×k) times, (2×k) times, ..., and ((n−1)×k) times of the unit time.

As described above, while the value of the parameter k is increased from zero to the maximum value (m−1), in synchronization with the phase advance of the High-level pulse of the clock signal CKA in the order of the phase control circuits $20_1, 20_2, \ldots,$ and $20_{n-1}$, the phase selection circuit 30 sequentially selects, one by one, the High-level pulse of the clock signal CKA input via the signal lines of Node 0, Node 1, Node 2, ..., and Node n−1.

By doing this, the phase of the High-level pulse of the clock signal CKB output from the phase selection circuit 30 is sequentially advanced by zero times, (1×k) times, (2×k) times, ..., and ((n−1)×k) times of the unit time in every one cycle in response to the phase of the High-level pulses of the clock signal CKA.

Namely, the phases of the High-level pulse in the cycle of the clock signal CKB are repeatedly advanced in the order of (0×0) times, (1×0) times, (2×0) times, ..., ((n−1)×0) times, (0×1) times, (1×1) times, (2×1) times, ..., ((n−1)×1) times, (0×(m−1)) times, (1×(m−1)) times, (2×(m−1)) times, ..., and ((n−1)×(m−1)) times of the unit time with respect to the phase of the High-level pulse of the clock signal CKA while the value of the parameter k is increased from zero to the maximum value (m−1).

Such reduction of the cycle of the clock signal CKB is performed to acquire the frequency characteristics of the Shmoo Plot within a single sequential process.

The sweep sequencer 40 is an example of a controller that outputs the phase control signals 1 through n−1 to be input into the phase control circuits $20_1, 20_2, \ldots,$ and $20_{n-1}$, respectively, and the phase selection signal to be input into the phase selection circuit 30.

The sweep sequencer 40 inputs the wrap signal which is an example of a control signal from the test pattern generation circuit 13 (see FIG. 2).

Further, as described above, the wrap signal is set to H level ("1") by the test pattern generation circuit 13 whenever one test pattern is completed, and is set to L level ("0") while the test pattern is performed.

The sweep sequencer 40 increases the value of the parameter k whenever the wrap signal is input.

The sweep sequencer 40 controls the phase control circuits $20_1, 20_2, \ldots,$ and $20_{n-1}$ and the phase selection circuit 30 by using the phase control signals 1 through n−1 and the phase selection signal, respectively. By doing this, the phase of the High-level pulse of the clock signal CKB output from the phase selection circuit 30 is sequentially advanced by the (0×k) times, (1×k) times, (2×k) times, . . . , and ((n−1)×k) times of the unit time with respect to the phase of the High-level pulse of the clock signal CKA while the value of the parameter k is sequentially increased by one per one cycle.

Figure 4:
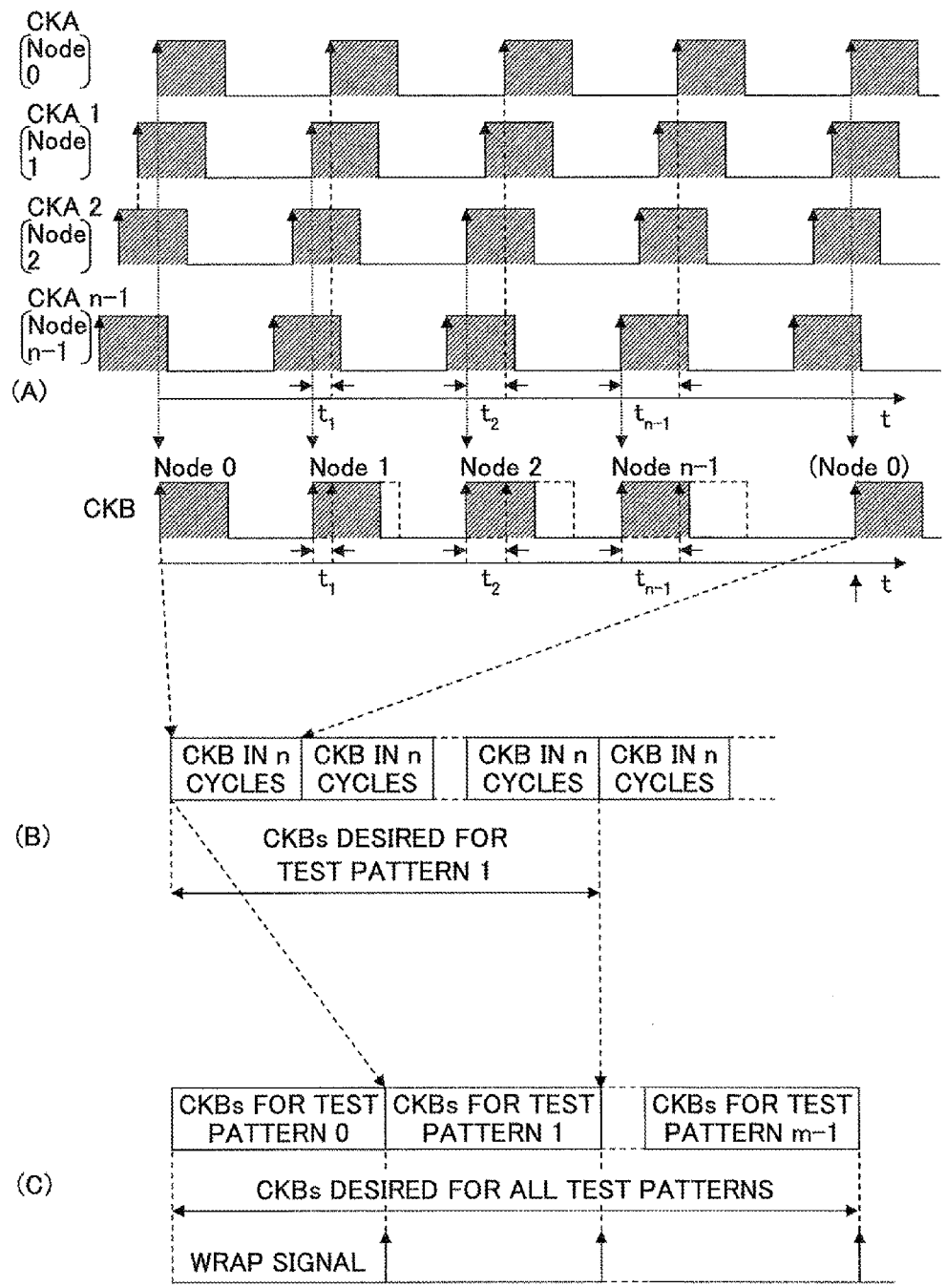
FIG. 4 is a timing chart illustrating a procedure of changing a frequency of a clock signal in the semiconductor circuit device 10 according to the first embodiment.

Here, with reference to a timing chart of FIG. 4, a procedure of changing the frequency of clock signal in the semiconductor circuit device 10 according to the first embodiment is described.

FIG. 4 is a timing chart illustrating a procedure of changing the frequency of the clock signal in the semiconductor circuit device 10 according to the first embodiment.

A part (A) of FIG. 4 illustrates waveforms of the clock signals CKA, CKA1, CKA2, . . . , and CKAn−1 to be input into the phase selection circuit 30 via the signals lines of Node 0, Node 1, Node 2, . . . , and Node n−1 and the clock signal CKB output from the phase selection circuit 30 when test pattern 1 (k=1) is applied to the target circuit 14.

A part (B) of FIG. 4 illustrates a relationship between the clock signal CKB in part (A) of FIG. 4 and all the clock signals CKB which are necessary for performing the test pattern 1 operation.

A part (C) of FIG. 4 illustrates relationships among the all the clock signals CKB necessary for performing the test pattern 1 operation, all the clock signals CKB necessary for performing the test pattern operations other than the test pattern 1, and the all the clock signals CKB necessary for performing all the test pattern operations, and the timings when the wrap signal is output.

In part (C) of FIG. 4, the clock signals CKB necessary for performing the test pattern operations are expressed as test patterns 0 through m−1.

As illustrated in part (A) of FIG. 4, the phases of the clock signals CKA1, CKA2, . . . , and CKAn−1 to be input into the phase selection circuit 30 via the signals lines of Node 1, Node 2, . . . , and Node n−1 are advanced with respect to the phase of the clock CKA to be input into the by phase selection circuit 30 via the signals lines of Node 0 by $t_{12}$ ((unit time)×1), $t_2$ ((unit time)×2), . . . , and $t_{n-1}$ ((unit time)×(n−1)).

The phases of the clock signals CKA1, CKA2, . . . , CKAn−1 in the signals lines of Node 1, Node 2, . . . , Node n−1 are advanced by the phase control circuits $20_1, 20_2, \ldots,$ and $20_{n-1}$ based on the phase control signals 1 through n−1, respectively, output from the sweep sequencer 40.

The phase selection circuit 30 generates the clock signal CKB by sequentially selecting the High-level pulses of the clock signals CKA, CKA1, CKA2, . . . , CKAn−1 which are input via the signal lines of Node 0, Node 1, Node 2, . . . , Node n−1 based on the phase selection signal input from the sweep sequencer 40.

By doing this, the clock CKB is a clock signal which is a combination of the High-level pulse of the clock CKA of Node 0, the High-level pulse of the clock CKA1 of Node 1, the High-level pulse of the clock CKA2 of Node 2, and the High-level pulse of the clock CKAn−1 of Node n−1.

Therefore, when compared with the clock CKA of node 0 where phase is not advanced at all, the phase of the clock CKB is gradually advanced and the frequency is increased in n cycles from Node 0 to Node n−1.

For example, in a case of n=4, the clock signal CKAn−1 of Node n−1 is CKA3 of Node 3. In this case, the clock signal CKB is a clock signal generated by sequentially combining the High-level pulses of the clock signals CKA, CKA1, CKA2, and CKA3 which are input via four signal lines Node 0 through Node 3. Therefore, during the four cycles from Node 0 to Node 3, the phase is gradually advanced and the frequency is increased.

Further, after selecting the clock signal CKAn−1 of the signal line of Node n−1, the phase selection circuit 30 selects the clock signal CKA of the signal line of Node 0. Therefore, the time period from starting falling down of the High-level pulse of the clock signal CKAn−1 of Node n−1 until rising up to the High-level pulse of the clock signal CKA of Node 0 is longer than the time period from starting falling down of the High-level pulse of any of the clock signals CKA of Node 0 to Node 2 until rising up to the High-level pulse of the next clock signal. The semiconductor circuit device 10 according to the first embodiment performs the BIST using one test pattern by repeating the n-cycle clock signals as described above.

Here, the number of cycles of the clock signal CKB desirable to perform one test pattern is much greater than n.

Therefore, as illustrated in part (B) of FIG. 4, the clock signal CKB desired to perform the test pattern 1 includes plural groups of n-cycle clock signal CKB.

Similar to the clock signal CKB of part (A) of FIG. 4, the n-cycle clock signal CKB in part (B) of FIG. 4 is a clock signal where the High-level pluses of clock signals CKA, CKA1, CKA2, . . . , CKAn−1 of Node 0, Node 1, Node 2, . . . , Node n−1 are combined.

Further, as illustrated in part (B) of FIG. 4, the wrap signal is set to High level ("1") by the test pattern generation circuit 13 when the test pattern is switched. Therefore, the wrap signal is output at the timing when desired clock signal CKB for performing test patterns ends. When the wrap signal is set to High level ("1") by the test pattern generation circuit 13, the value of the parameter k is increased by one.

As described above, according to the first embodiment, by sequentially changing the operation frequency of the test pattern within one time using m test patterns which are test patterns 0 through m−1, it may become possible to sequentially acquire the frequency characteristics of a Shmoo Plot within one process.

Therefore, as illustrated in part (C) of FIG. 4, the clock signal CKB desired for all the test patterns 0 through m−1 for sequentially acquiring the frequency characteristics of a Shmoo Plot within one process is a clock signal generated in a manner that clock signals desired to perform the respective test pattern operations 0 through m−1 are sequentially arranged.

The cycles (cycle periods) of the clock signals included in the test patterns 0 through m−1 are reduced by the rates of (1×k) times, (2×k) times, . . . , and ((n−1)×k) times of the unit time in the phase control circuits $20_1$, $20_2$, . . . , and $20_{n-1}$, respectively.

In the case of the test pattern 0, k equals to zero. Therefore, the phases of the clock signals CKA1, CKA2, . . . , CKAn−1 are the same as that of the clock signal CKA. As a result, the phase of the clock CKB is not advanced. Also, the clock signal CKB having the same phase as that of the clock signal CKA is output from the phase selection circuit 30.

On the other hand, when the value of the parameter k is greater than one, the reduction levels as given in the formulas of (1×k) times, (2×k) times, . . . , and ((n−1)×k) times of the unit time are increased. Therefore, the phases of the rising High-level pulses of Node 1, Node 2, . . . , and Node n−1 are more advanced when compared with the clock signal CKB when k=1 of part (A) of FIG. 4.

As described above, in the semiconductor circuit device 10 according to the first embodiment, as illustrated in parts (A) through (C) of FIG. 4, it may become possible to perform the BIST by using the clock signal CKB in which the cycle is reduced (the frequency is increased) by gradually advancing the phase thereof.

The cycle of the clock signal CKB is gradually reduced while the value of the parameter k changes from k=0 to k=m−1. In the case where the cycle is most reduced, the cycle is reduced by ((n−1)×(m−1)) times when compared with the cycle having the rising timing of the High-level pulse of Node 0.

Therefore, if the frequency of the clock signal CKA, the values of m and n, and the unit time are set so as to cover all the frequency characteristics of the Shmoo Plot in the semiconductor circuit device 10, it may become possible to acquire the frequency characteristics of Shmoo Plot by performing a single sequential BIST.

By doing this, it may become possible to greatly reduce the time for generating the Shmoo Plot of the semiconductor circuit device 10.

Here, it is assumed that the target circuit 14 has 2 kw (kilo words) memory and the address length is N in the semiconductor circuit device 10, and a case is described where a test pattern corresponding to (address length N)×(12 times) is applied to the target circuit 14. Further, it is assumed that, for example, the operation frequency is 2 GHz; that is, one cycle has 500 ps.

The time period to perform one BIST using test patterns is obtained by calculation as follows: (2 kw (2048 words))×12× (500 ps)=approximately 12.3 μs.

For example, when the number of the test patterns is 12, the semiconductor circuit device 10 according to the first embodiment may sequentially apply those 12 test patterns to the target circuit 14 within a single process. Therefore, the test time necessary for acquiring the BIST test results using 12 test patterns is approximately 150 μs.

On the other hand, for example, in the semiconductor circuit device 1 of the comparative example in which it is required to change the output frequency of the PLL 12 whenever the frequency is to be changed to acquire frequency characteristics of the Shmoo Plot, it may take approximately 15 ms to execute 12 BISTs using the test patterns.

Therefore, in the above cases, the time period desired for acquiring the frequency characteristics of the Shmoo Plot in the semiconductor circuit device 10 according to the first embodiment is approximately one-tenth of the time period required for performing a single test pattern semiconductor circuit device 1 according to the comparative example.

As described above, according to the first embodiment, by making it possible to change the frequency of the clock signal for BIST (BIST clock signal), it becomes no longer necessary to change the PLL settings. As a result, it may become possible to provide a semiconductor circuit device with greatly reduced test time.

In the above description, an embodiment is described in which the phase of the clock signal CKA is advanced. However, a clock signal CKB generated by delaying the phase of the clock signal CKA may be used. To that end, for example, the frequency that is reduced most aa last in the BIST described above is set to the initial frequency of the clock signal CKA, and the frequency of Node 0 and the frequency of Node n−1 described above are exchanged with each other, and the BIST is performed by generating the clock signal CKB in a manner that the cycle thereof is gradually increased while the BIST progresses.

Second Embodiment

In this second embodiment, a circuit configuration of the semiconductor circuit device according to the first embodiment is more specified.

Figure 5:
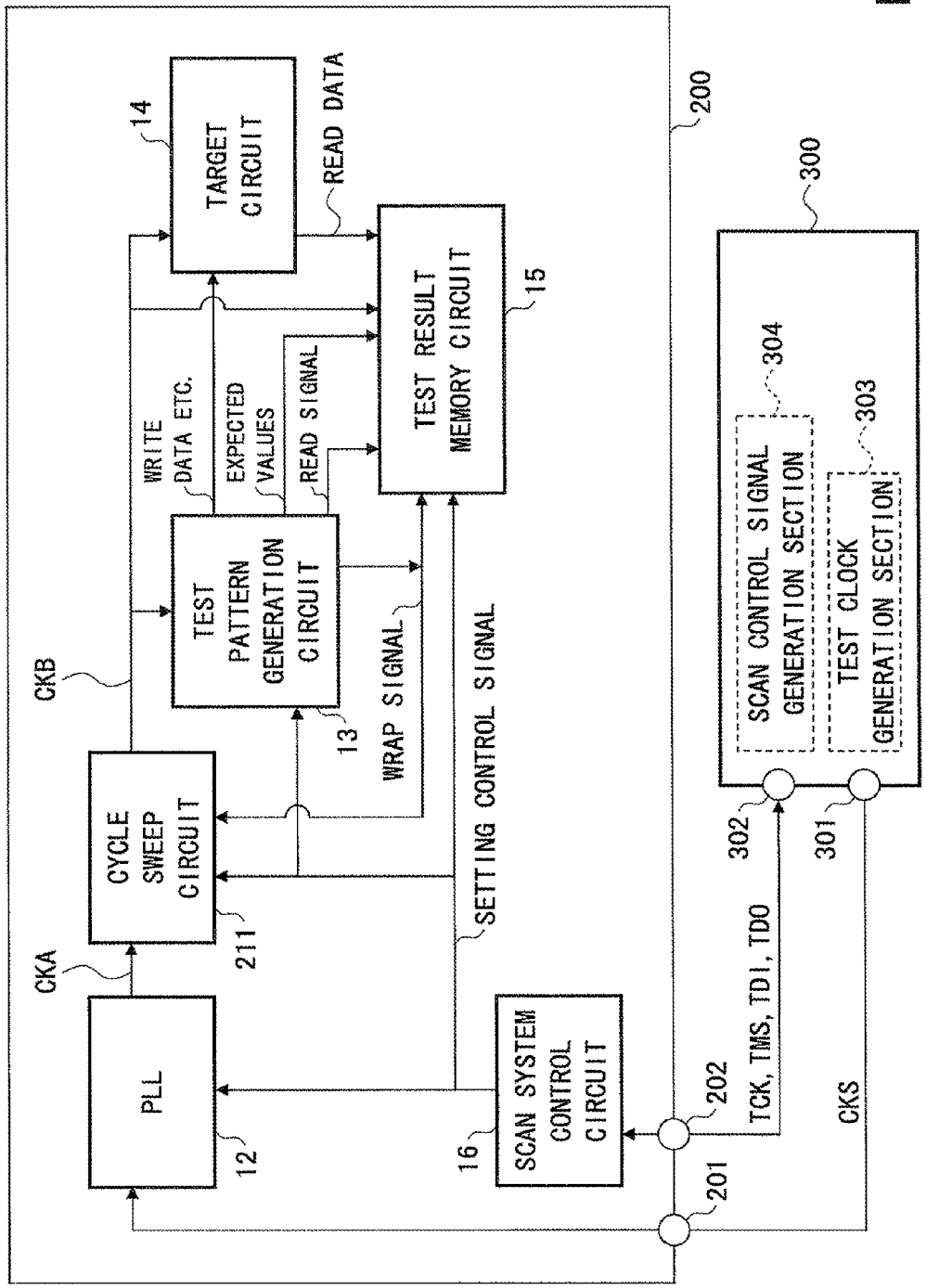
FIG. 5 is a drawing illustrating where a semiconductor circuit device 200 according to a second embodiment is connected to an LSI tester.

FIG. 5 illustrates a state where a semiconductor circuit device according to the second embodiment is connected to an LSI tester.

A semiconductor circuit device 200 according to the second embodiment includes a cycle sweep circuit 211, the PLL 12, the test pattern generation circuit 13, the target circuit 14, the test result memory circuit 15, and a scan system control circuit 16.

Further, the semiconductor circuit device 200 includes terminals 201 and 202 to be connected to an LSI tester 300. The terminals 201 and 202 are connected to terminals 301 and 302, respectively, of the LSI tester 300.

The LSI tester 300 includes a test clock output section 303 that outputs a test clock (CKS) and a scan control signal output section 304 that outputs a scan control signal.

The terminal 201 of the semiconductor circuit device 200 inputs the test clock signal (CKS) output from the test clock output section 303 of the LSI tester 300. The terminal 202 of the semiconductor circuit device 200 inputs the scan control signal (TCK, TMS) and test data for scan test (TDI) output from the scan control signal output section 304 of the LSI tester 300. Further, the data indicating scan test results (TDO) are output from the terminal 202 of the semiconductor circuit device 200.

Further, the TCK denotes a clock signal for scan test, and the TMS denotes a signal for controlling a state transition of the scan system control circuit 16.

The PLL 12 in the second embodiment is fundamentally the same as the PLL 12 of the semiconductor circuit device 10 according to the first embodiment. But, the PLL 12 in the second embodiment inputs the test clock signal (CKS) from the LSI tester 300.

The test pattern generation circuit 13 in the second embodiment is fundamentally the same as the test pattern generation circuit 13 in the first embodiment. But, in the second embodiment, the test pattern generation circuit 13 inputs a READ signal into the test result memory circuit 15. Further, the READ signal is a signal to control reading the test results into the test result memory circuit 15, and details of the READ signal are described below.

The target circuit 14 in the second embodiment is fundamentally the same as the target circuit 14 in the first embodiment. But, in the second embodiment, after the BIST is performed, the target circuit 14 inputs the data remaining in the bit cells of the target circuit 14 into the test result memory circuit 15 as the READ data.

The test result memory circuit 15 in the second embodiment is fundamentally the same as the test result memory circuit 15 of the semiconductor circuit device 10 according to the first embodiment. But, the test result memory circuit 15 in the second embodiment inputs the READ signal from the test pattern generation circuit 13 and the READ data from the target circuit 14. Further, the test result memory circuit 15 inputs the test results into the scan system control circuit 16.

The cycle sweep circuit 211 in the second embodiment is fundamentally the same as the cycle sweep circuit 11 in the first embodiment. But, the cycle sweep circuit 211 in the second embodiment inputs a setting control signal. The setting control signal is output from the scan system control circuit 16.

The scan system control circuit 16 is a circuit that controls the scan shift of the LSI 10 (the semiconductor circuit device 200). When the scan shift signal is input from the LSI tester 300 into the LSI, the scan system control circuit 16 inputs the setting control signal into the cycle sweep circuit 211, the PLL 12, and the test result memory circuit 15. The setting control signal is a signal that performs initial setting on the cycle sweep circuit 211, the PLL 12, and the test result memory circuit 15 before performing the BIST.

In the initial setting, the cycle sweep circuit 211 sets "0" to the value of the parameter k, the PLL 12 is activated to output the clock signal CKA based on the test clock signal CKS input from the LSI tester, the test pattern generation circuit 13 initializes the test patterns stored therein, and the test result memory circuit 15 resets the values of the registers therein.

Next, with reference to FIG. 6, the cycle sweep circuit 211 of the semiconductor circuit device 200 according to the second embodiment is described.

FIG. 6 illustrates the cycle sweep circuit 211 of the semiconductor circuit device 200 according to the second embodiment.

In the following, differences between the cycle sweep circuit 211 in the second embodiment and the cycle sweep circuit 11 in the first embodiment are mainly described.

As illustrated in FIG. 6, the cycle sweep circuit 211 includes the clock input terminal 11A, the clock output terminal 11B, the wrap signal input terminal 11C, a setting control signal input terminal 11D, the phase control circuits $20_1, 20_2, \ldots,$ and $20_{n-1}$, the phase selection circuit 30, and the sweep sequencer 40.

The elements of the cycle sweep circuit 211 are the same as those in the cycle sweep circuit 11 in the first embodiment, except for the setting control signal input terminal 11D.

Further, the signals handled in the cycle sweep circuit 211 are the same as those in the cycle sweep circuit 11 in the first embodiment, except for the setting control signal, which is input from the LSI tester 300 into the sweep sequencer 40 via the setting control signal input terminal 11D, and a step number signal and a termination signal output from the sweep sequencer 40.

As described above, the setting control signal is a signal to perform the initial settings on the cycle sweep circuit 211, the PLL 12, and the test result memory circuit 15 before the performance of the BIST.

Therefore, upon the input of the setting control signal, the sweep sequencer 40 in the cycle sweep circuit 211 sets initial values to the phase control signals 1 through n−1 and the phase selection signal, and also sets a predetermined value (hereinafter may be referred to as the step number) as the step number signal.

As the step number of the step number signal, any integer greater than zero may be set. The step number signal is a signal to acquire integer multiples of the reduction levels of the phase control signals 1 through n−1.

Namely, the step number signal expresses a value to be multiplied to the values (1×k) times, the (2×k) times, . . . , and the ((n−1)×k) times which are applied to the phase control signals 1 through n−1 so that the cycles of the clock signal CKB are reduced by the phase control circuits $20_1, 20_2, \ldots,$ and $20_{n-1}$ based on the phase control signals 1 through n−1, the cycles being included in the test patterns 0 though m−1 of the unit time.

In the description of the second embodiment, a case is described where the step number is one. However, any integer greater than one may be set as the step number when it is desired to further reduce the cycles of the test patterns based on the integer multiple of the values of the above formulas when the BIST is performed.

For example, if the step number is set to two, the cycles of the clock signal CKG is reduced by (1×k)×2 times, (2×k)×2 times, . . . , and ((n−1)×k)×2 times by the phase control circuits $20_1, 20_2, \ldots,$ and $20_{n-1}$, respectively.

The termination signal is a signal indicating the end of the BIST, and is output from the sweep sequencer 40 when the test number increased and counted by the counter in the sweep sequencer 40 is equal to a predetermined value. When the termination signal output from the sweep sequencer 40 is input into the phase selection circuit 30, the phase selection circuit 30 stops generating the clock signal CKB, so as to stop the output of the clock signal CKB.

By doing this, the operations of the test pattern generation circuit 13, the target circuit 14, and the test result memory circuit 15 are stopped, and the BIST ends.

Figure 7A:
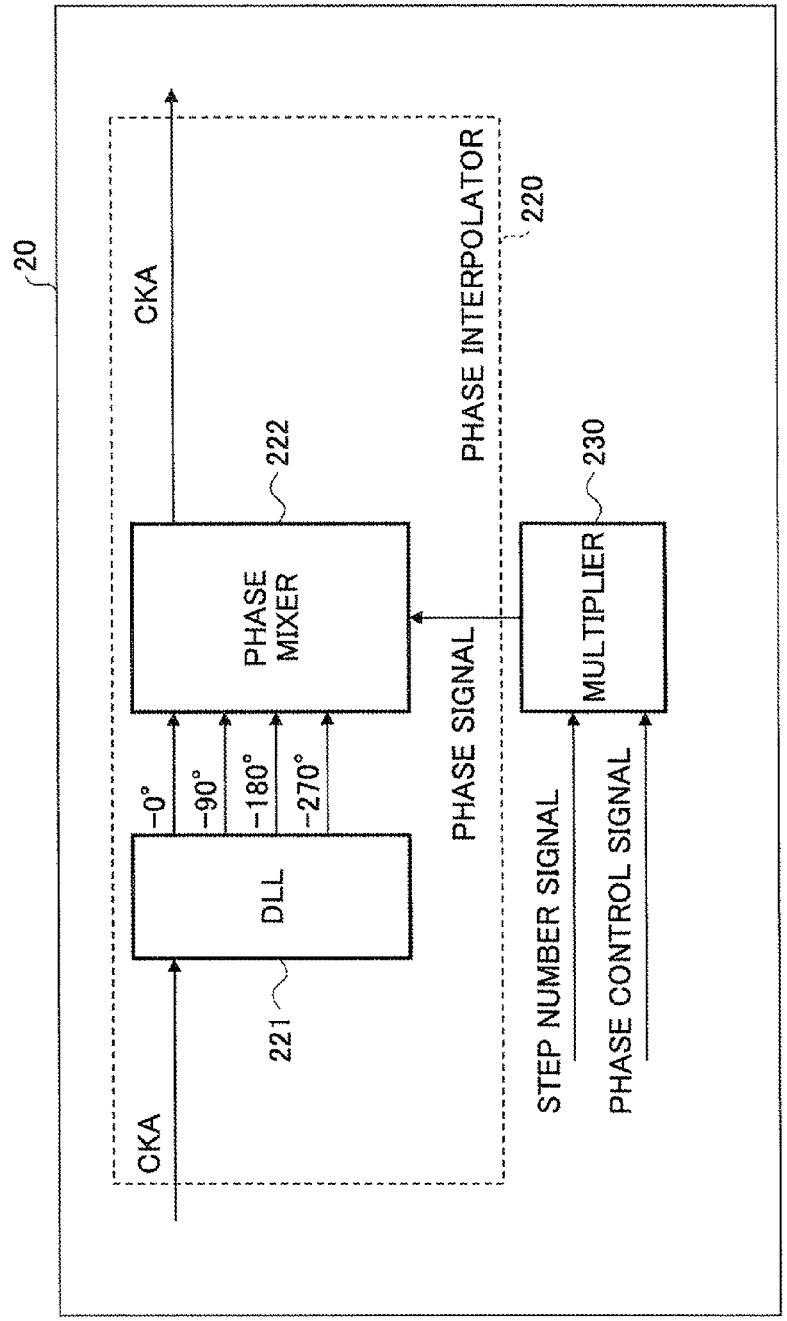
FIG. 7A is a drawing illustrating a phase control circuit 20 of the semiconductor circuit device 200 according to the second embodiment.

Next, with reference to FIGS. 7A and 7B, a specific (exemplary) circuit configuration of the phase control circuits $20_1, 20_2, \ldots,$ and $20_{n-1}$ is described. Further, the circuit configurations of the phase control circuits $20_1, 20_2, \ldots,$ and $20_{n-1}$ are similar to each other. Therefore, in the following, the phase control circuits $20_1, 20_2, \ldots,$ and $20_{n-1}$ are not separately described but collectively described using the term phase control circuit 20.

FIG. 7A illustrates the phase control circuit 20 of the semiconductor circuit device 200 according to the second embodiment.

FIG. 7B is a timing chart illustrating the operating principle of the phase control circuit 20 of the semiconductor circuit device 200 according to the second embodiment.

As illustrated in FIG. 7A, the phase control circuit 20 includes a phase interpolator 220 and a multiplier 230.

The phase interpolator 220 includes a Delay Locked Loop (DLL) 221 and a phase mixer 222.

The DLL 221 inputs the clock signal CKA, and outputs the phase of the clock signal CKA. In this embodiment, for example, the DLL 221 outputs four clock signals in which the phase of the clock signal is shifted (changed) by 0 degrees, −90 degrees, −180 degrees, and −270 degrees.

Here, the three clock signals in which the phase is shifted by −90 degrees, −180 degrees, and −270 degrees correspond to the signals in which the phase thereof is advanced by 90 degrees, 180 degrees, and 270 degrees, respectively.

The phase mixer 222 inputs the four clock signals output from the DLL 221, advances the phase of the clock signal CKA based on the phase signal input from the multiplier 230, and outputs the clock signal CKA.

Here, the phase mixer 222 has the resolution so as to divide 360 degrees, which is the phase amount of one cycle, into a predetermined number. By generating the phase difference based on the phase amount calculated by dividing 360 degrees by the predetermined number as the minimum unit, the phase mixer 222 changes the phase of the clock signal CKA by the phase difference corresponding to an integer multiple of the minimum unit.

Further, the phase signal is a signal to designate the change amount of the phase used in the phase mixer 222.

For example, it is assumed that the resolution of the phase mixer 222 is 64. In this case, as illustrated in FIG. 7B, the phase mixer 222 may generate a phase difference determined by using the phase amount (one division) which is obtained by dividing 360 degrees by 64.

For example, it is assumed that the phase mixer 222 combines the output of phase 0 degrees and the output of phase −90 degrees from DLL 221, divides the combined result by 16, and output the result. Further, the output of phase 0 degrees from the DLL 221 is the clock signal having the same cycle and phase as those of the clock signal CKA to be input into the control circuit 20.

For example, when it is assumed that the frequency of the clock signal A is 2 GHz, the one cycle of the clock signal CKA is 500 ps, and the time width of the minimum unit after dividing into 64 is calculated as in the formula: 500 ps/64=approximately 7.8 ps.

In this case, by designating the minimum unit of time (i.e., approximately 7.8 ps: one division) in the phase signal, the phase mixer 222 may advance the phase of the clock signal CKA by the minimum unit of time (i.e., approximately 7.8 ps: one division), and output it as the clock signal CKB.

The multiplier 230 inputs the phase control signal and the step number signal, and outputs the phase signal which is obtained by multiplying the phase control signal by the step number signal.

As described above, the phase control signal indicates the time to reduce the one cycle of the clock signal CKA.

Further, the step number signal is a signal to calculate an integer (step number) multiple of the reduction time of the cycle based on the phase control signal.

Therefore, the phase signal obtained by multiplying the phase control signal by the step number indicates the time corresponding to the advanced phase of the clock signal CKA in the control circuit 20. As described above, the phase signal is the signal to set the value to be used to designate the change amount of the phase in the phase mixer 222.

In FIGS. 7A and 7B, the phase control circuits $20_1$, $20_2$, ..., and $20_{n-1}$ are not separately described but collectively described as the phase control circuit 20. However, actually, the phase of the clock signal CKA is advanced in the phase control circuits $20_1$, $20_2$, ..., and $20_{n-1}$.

By doing as described above, the phase control circuit 20 including the phase interpolator 220 and the multiplier 230 changes the frequency of the clock signal CKA and outputs the clock signal CKA.

Figure 8:
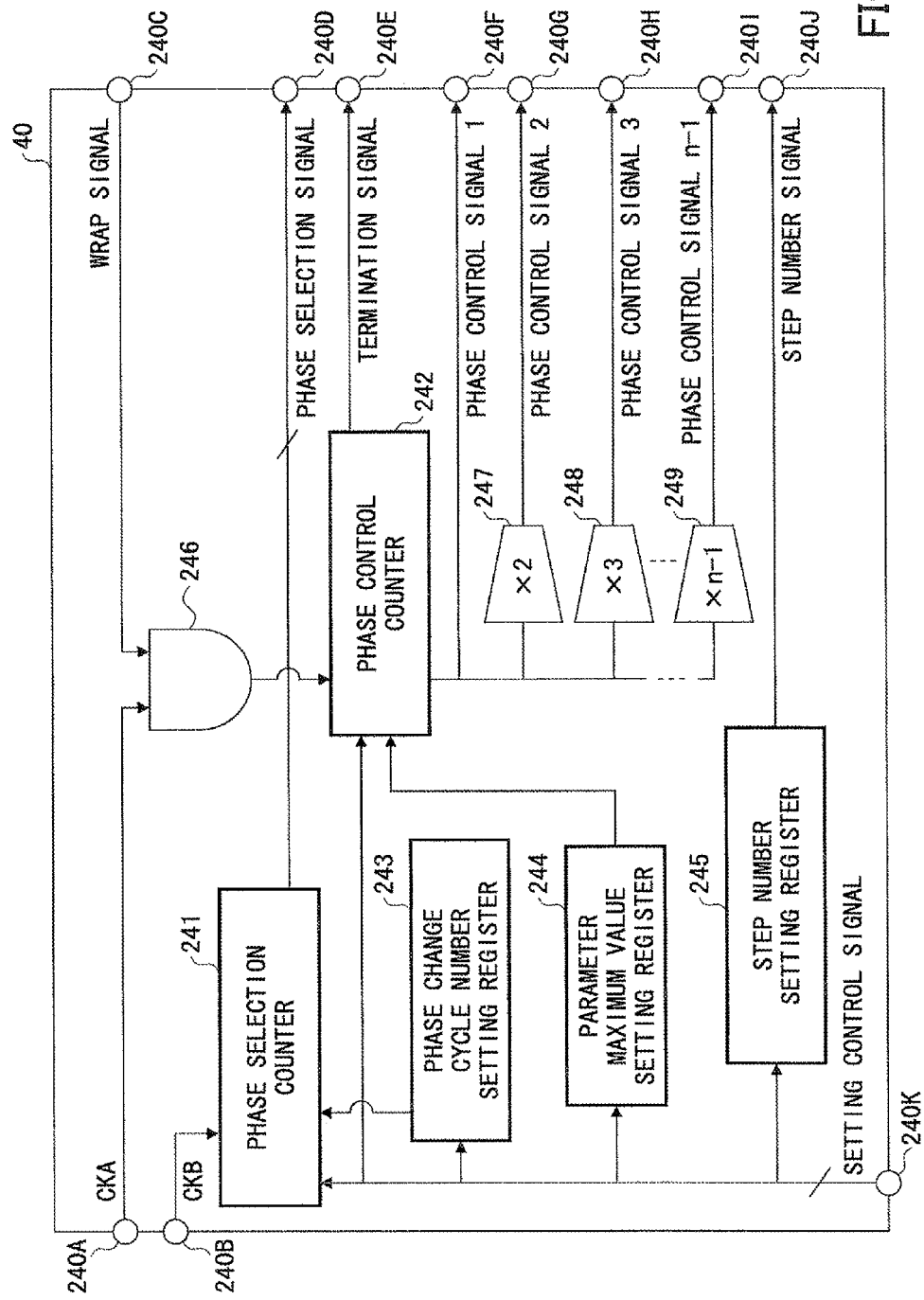
FIG. 8 is a drawing illustrating a sweep sequencer 40 of the semiconductor circuit device 200 according to the second embodiment.

Next, with reference to FIG. 8, an exemplary circuit configuration of the sweep sequencer 40 is described.

FIG. 8 illustrates the sweep sequencer 40 of the semiconductor circuit device 200 according to the second embodiment.

The sweep sequencer 40 in the second embodiment includes a phase selection counter 241, a phase control counter 242, a phase change cycle number setting register 243, a parameter maximum value setting register 244, a step number setting register 245, an AND circuit 246, and multipliers 247, 248, and 249.

Further, the sweep sequencer 40 in the second embodiment includes clock signal input terminals 240A and 240B, a wrap signal input terminal 240C, a phase selection signal output terminal 240D, a termination signal output terminal 240E, phase control signal output terminals 240F through 240I, a step number signal output terminal 240J, and a setting control signal input terminal 240K.

The clock signal input terminals 240A and 240B are the terminals to input the clock signals CKA and CKB, respectively, into the sweep sequencer 40.

The wrap signal input terminal 240C is the terminal to input the wrap signal into the sweep sequencer 40.

The phase selection signal output terminal 240D is the terminal to output the phase selection signal from the sweep sequencer 40 to the phase selection circuit 30.

The termination signal output terminal 240E is the terminal to output the termination signal from the sweep sequencer 40 to the phase selection circuit 30.

The phase control signal output terminals 240F through 240I are the terminals to output the phase control signals 1 through n−1 from the sweep sequencer 40 to the phase control circuits $20_1$, $20_2$, ..., and $20_{n-1}$.

The step number signal output terminal 240J is the terminal to output the step number signal from the sweep sequencer 40 to the phase control circuits $20_1$, $20_2$, ..., and $20_{n-1}$.

The setting control signal input terminal 240K is the terminal to input the setting control signal into the sweep sequencer 40.

The phase selection counter 241 inputs the clock signal CKA via the clock signal input terminal 240B, the setting control signal via the setting control signal input terminal 240K, and a phase change cycle number signal from the phase change cycle number setting register 243.

The phase selection counter 241 is a counter that stores the Node numbers expressed by the phase selection signal. Before the BIST is performed, upon inputting the setting control signal, the phase selection counter 241 initializes the value of the counter. The value of the phase selection counter 241 in the initial setting is "0" which indicates Node 0.

The phase selection counter 241 is an up counter and repeatedly counts until the counter value is equal to the cycle number (n) indicated by the phase change cycle number signal input from the phase change cycle number setting register 243.

The cycle number (n) indicated by the phase change cycle number signal correspond to the number of Nodes (Node 0, Node 1, Node 2, ..., and Node n−1).

Therefore, the phase selection counter 241 repeatedly counts the Node number (0 through n−1) whenever the clock CKB is input, and outputs the phase selection signal indicating the counter value (0 through n−1) whenever counting the clock signal CKB. The phase selection counter 241 is an example of a selection signal generator. The phase selection signal is input into the phase selection circuit 30 via the phase selection signal output terminal 240D.

The phase control counter 242 inputs the setting control signal via the setting control signal input terminal 240K, and also inputs an oscillation number signal from the parameter maximum value setting register 244.

The phase control counter 242 is an up counter and counts the value of parameter k included in the phase control signals 1 through n−1 to be input into the phase control circuits $20_1$, $20_2$, ..., and $20_{n-1}$.

Upon inputting the setting control signal from the LSI tester 300 via the setting control signal input terminal 240K, the phase control counter 242 initializes the value of the register. The value of the phase control counter 242 in the initial setting is "0". Namely, the value of the parameter k is initialized and set to "0".

The phase control counter 242 increases (counts up) the value of the parameter k by one whenever the High-level signal is input from the AND circuit 246.

The output from the phase control counter 242 is (becomes) a phase control signal 1 (1×k), and is input into the multipliers 247, 248, and 249.

When the value of the parameter k is equal to the maximum value m input from the parameter maximum value setting register 244, the phase control counter 242 outputs the termination signal. The termination signal is input into the phase selection circuit 30 via the termination signal output terminal 240E.

The phase change cycle number setting register 243 stores the number (n), as the cycle number, of the Nodes (Node 0, Node 1, Node 2, ..., Node n−1) selected by the phase control signals 1 through n−1, and inputs the cycle number (n), as the phase change cycle number signal, into the phase selection counter 241.

Further, when the setting control signal is input via the setting control signal input terminal 240K, the phase change cycle number setting register 243 sets n to the cycle number.

The parameter maximum value setting register 244 stores the maximum value (m) of the parameter k, and inputs the maximum value (m) into the phase control counter 242.

Further, when the setting control signal is input via the setting control signal input terminal 240K, the parameter maximum value setting register 244 sets m to the maximum value.

The step number setting register 245 stores the step number of the step number signal described above. The step number signal output from the step number setting register 245 is input into the phase control circuits $20_1, 20_2, \ldots,$ and $20_{n-1}$ via the step number signal output terminal 240J.

The AND circuit 246 outputs the logical product ("AND" operation result) of the clock signal CKA and the wrap signal, and, when the wrap signal is set to High-level ("1"), inputs High level ("1") into the phase control counter 242. The High-level ("1") of the wrap signal corresponds to the completion of one test pattern.

The multipliers 247, 248, and 249 generate timings in accordance with the results that the parameter k output from the phase control counter 242 is multiplied by 2, 3, and n−1, and output the phase control signals 2, 3, and n−1, respectively, based on the generated timings.

Further, the value of the phase control counter 242 (parameter k) is directly set to the phase control signal 1. Therefore, no multiplier is inserted (provided) between the phase control counter 242 and the phase control signal output terminal 240F.

The phase control signals 1 through n−1 are output via the phase control signal output terminals 240F through 240I and input into the phase control circuits $20_1, 20_2, \ldots,$ and $20_{n-1}$.

Further, the phase control counter 242, the AND circuit 246, and the multipliers 247, 248, and 249 are an examples of a phase control signal generator.

In the above sweep sequencer 40, when the value of the parameter k is increased from 0 to m−1, the values of the phase control signals 1 through n−1 changes as follows:
(1×0), (2×0), (3×0), ..., ((n−1)×0), (0×1), (1×1), (2×1), (3×1), ..., ((n−1)×1), ..., (0×(m−1)), (1×(m−1)), (2×(m−1)), (3×(m−1)), ..., and ((n−1)×(m−1)).

Based on those phase control signals 1 through n−1, the clock signal CKG having the reduced cycles in the phase selection circuit 30 is generated.

Figure 9A:
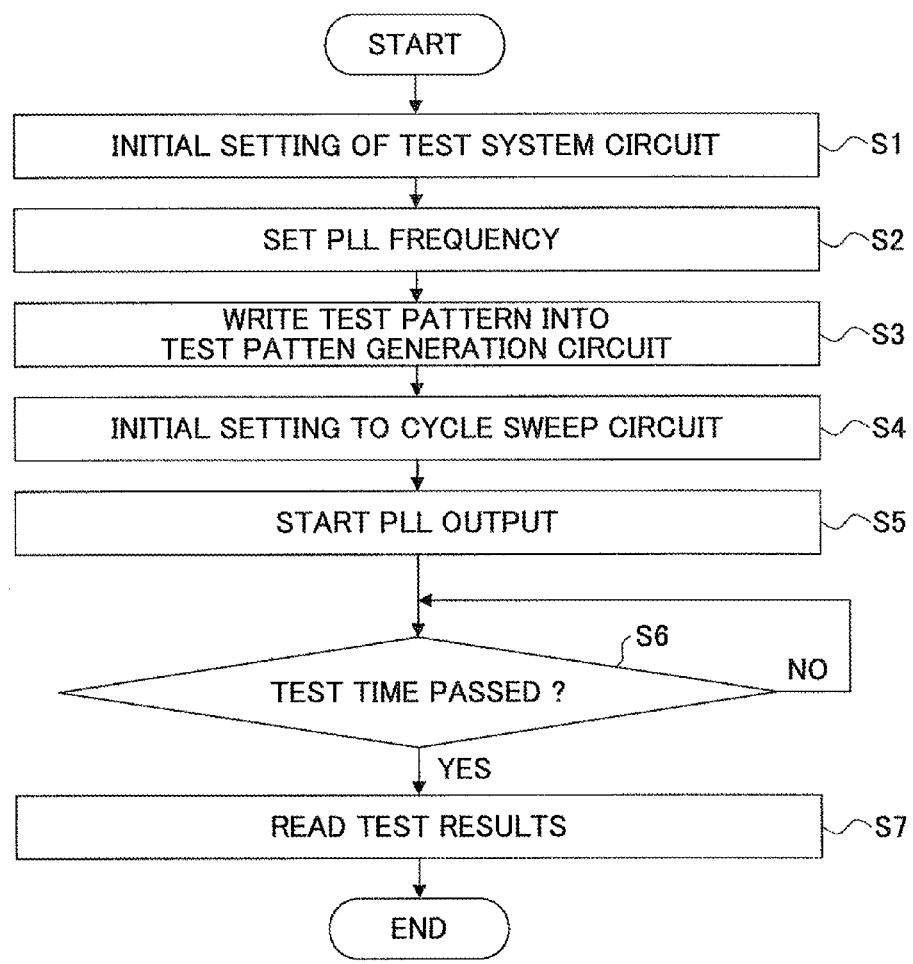
FIG. 9A is a flowchart illustrating a process performed by a scan system control circuit 16 of the semiconductor circuit device 200 according to the second embodiment.

Next, with reference to FIGS. 9A and 9B, the processes performed by the scan system control circuit 16 and the sweep sequencer 40 of the semiconductor circuit device 200 according to the second embodiment are described.

FIG. 9A illustrates is a flowchart illustrating a process performed by the scan system control circuit 16 of the semiconductor circuit device 200 according to the second embodiment. More specifically, FIG. 9A illustrates a process performed by the scan system control circuit 16 when the BIST is performed in the semiconductor circuit device 200.

When the process starts (START), the scan system control circuit 16 initializes test system circuits (step S1). Specifically, the scan system control circuit 16 inputs the setting control signal into the PLL 12, the cycle sweep circuit 211, the test pattern generation circuit 13, and the test result memory circuit 15, so as to initialize the circuits (12, 211, 13, and 15).

In the initial settings, the cycle sweep circuit 211 sets the parameter k to zero, the PLL 12 is activated to output the clock signal CKA based on the test clock signal CKS input from the LSI tester 300, the test pattern generation circuit 13 initializes the test patterns stored therein, and the test result memory circuit 15 resets the values of the registers thereof.

Next, the scan system control circuit 16 sets the frequency for BIST (BIST frequency) to the frequency of the clock signal output from the PLL 12 (step S2). By doing this, the frequency of the clock signal output from the PLL 12 is set to the frequency of the clock signal that is used in the BIST.

The scan system control circuit 16 writes a test pattern into the test pattern generation circuit (step S3). Herein, the test pattern refers to the data to be written into all the bit cells included in the target circuit 14, the address data of the bit cells, the W/E signal data, the data indicating the expected values and the like.

Next, the scan system control circuit 16 sets the initial phase of the cycle sweep circuit 211 (step S4). Herein, the initial phase refers to a changing amount of the phase when the phase of the clock signal CKA is changed by the cycle sweep circuit 211. Here, the initial phase is set to zero.

The scan system control circuit 16 causes the PLL 12 to start oscillating (generating) the clock signal CKA (step S5). By doing this, The PLL 12 outputs the clock signal CKA.

Next, the scan system control circuit 16 determines whether the BIST test time has passed (step S6). Here, the BIST test time refers to the time (time period) that is required to acquire the frequency characteristics of the Shmoo Plot by changing the phase of the clock signal CKB, and is set to the time period that is determined by adding the time period required to acquire the frequency characteristics of the Shmoo Plot to a predetermined compensation time period. Here, the time period required to acquire the frequency characteristics of the Shmoo Plot may be determined in advance based on the number of words, the length of the address, operation frequency and the like.

Further, the process in step S6 is repeatedly performed until the scan system control circuit 16 determines that the BIST test time has passed.

When determining that the BIST test time has passed (YES in step S6), the scan system control circuit 16 reads the BIST test results from the test result memory circuit 15 and transmits the test results to the LSI tester 300 (step S7).

The BIST test results indicate whether the operation of the target circuit 14 is passed or failed (good or no good). Accordingly, the LSI tester 300 may recognize the BIST test results.

As described above, with reference to FIG. 9A, the process performed by the scan system control circuit 16 to acquire the frequency characteristics of the Shmoo Plot within one sequential process is described.

On the other hand, to acquire a Shmoo plot which is based on not only changing the frequency but also the power voltage applied to the target circuit 14 and the temperature of the semiconductor circuit device 200, the setting of the power voltage or the temperature may be changed, so that the frequency characteristics may be sequentially acquired within one process under each of the conditions of the power voltages or temperatures. By doing this, when compared with a semiconductor circuit device according to a comparative example, it may become possible to greatly reduce the time period desired to acquire the Shmoo Plot including not only the frequency characteristics but also power voltage characteristics or temperature characteristics.

Next, with reference to FIG. 9B, a process performed by the sweep sequencer 40 of the semiconductor circuit device 200 according to the second embodiment to acquire the frequency characteristics of the Shmoo Plot is described.

FIG. 9B is a flowchart illustrating a process performed by the sweep sequencer 40 of the semiconductor circuit device 200 according to the second embodiment. The process illustrated in FIG. 9B is performed by the sweep sequencer 40 to change the frequency of the clock signal CKB by the cycle sweep circuit 211 when the BIST is performed in the semiconductor circuit device 200.

When starting the process (START), the sweep sequencer 40 outputs the phase control signals 1 through n−1 one by one (step S11).

Here, to cause the phase selection circuit 30 to select the signal line of Node 0, the sweep sequencer 40 sets all the phase control signals 1 through n−1 to non-selective (i.e., L (Low) level). By doing this, the phase selection circuit 30 selects the signal line of Node 0.

On the other hand, to cause the phase selection circuit 30 to select any of the signal lines of Node 1 through n−1, the sweep sequencer 40 sets only the phase control signal corresponding to the Node number of the signal line to be selected to selective (i.e., H (High) level), and also sets the other phase control signals corresponding to the Node numbers of the signal lines that are not to be selected to non-selective (L (Low) level).

The sweep sequencer 40 determines whether all the signals lines of Node 0 through Node n−1 have been sequentially selected by the phase selection circuit 30 (step S12). Namely, sweep sequencer 40 determines whether the signal lines of Node 0 through Node n−1 have been sequentially selected one by one by using the phase control signals 1 through n−1.

Therefore, when the sweep sequencer 40 determines that all the signals lines of Node 0 through Node n−1 have not been sequentially selected by the phase selection circuit 30 (NO in step S12), the process goes back to step S11. As described above, in step S11, the sweep sequencer 40 outputs the phase control signal to select the signal line corresponding to the next Node number.

By repeating steps S11 and S12, the phase selection circuit 30 may sequentially select the signal lines of Node 0 through Node n−1 one by one.

When determining that all the signals lines of Node 0 through Node n−1 have been sequentially selected by the phase selection circuit 30 (YES in step S12), the sweep sequencer 40 further determines whether the wrap signal is set (raised) to High level ("1") (step S13). The wrap signal is the signal that is to be raised to H level by the test pattern generation circuit 13 when the test pattern is switched.

When the sweep sequencer 40 determines that the wrap signal in High level ("1") is not input (NO in step S13), the process goes back to step S11.

As a result, the process of steps 11 and 12 is repeatedly performed until the wrap signal in High level ("1") is input. Namely, the phase selection circuit 30 may sequentially select the signal lines of Node 0 through Node n−1 one by one.

Accordingly, the selections of the signal lines of Node 0 through Node n−1 by the phase selection circuit 30 are repeated until it is determined that the wrap signal in High level is input.

When determining that the wrap signal in High level is input in step S13, (YES in step S13), the sweep sequencer 40 increases the value of the parameter k by one (step S14).

In the process of step 14, a preparation is made to perform the BIST in which the phase of the clock signal CKB is more changed than before in response to the increase of the value of the parameter k by one.

The sweep sequencer 40 stores the test results into the test result memory circuit 15. By steps S11 through S13, the BIST test results corresponding to one test pattern are acquired. Therefore, the BIST test results are stored into test result memory circuit 15 so as to be read by the LSI tester 300 later.

The sweep sequencer 40 determines whether the value of the parameter k is equal to m (step S16). In the BIST, the test patterns 0 though m−1 are used. Therefore, when the value of the parameter k is equal to m, the BIST using up to the test pattern m−1 may be completed. Accordingly, the completion of all the BISTs is determined based on whether the value of the parameter k is equal to m.

When the sweep sequencer 40 determines that the value of the parameter k is not equal to m (NO in step S16), the process goes back to step S11. By doing this, the process of steps S11 though S13 is repeated using the parameter k having the value increased by one in step S14.

When the sweep sequencer 40 determines that the value of the parameter k is equal to m (YES in step S16), the process ends.

By doing this, it may become possible to acquire the Shmoo Plot in a case where the phase of the clock signal CKB is changed in response to all the values from 0 through m−1 of the parameter k.

Figure 10:
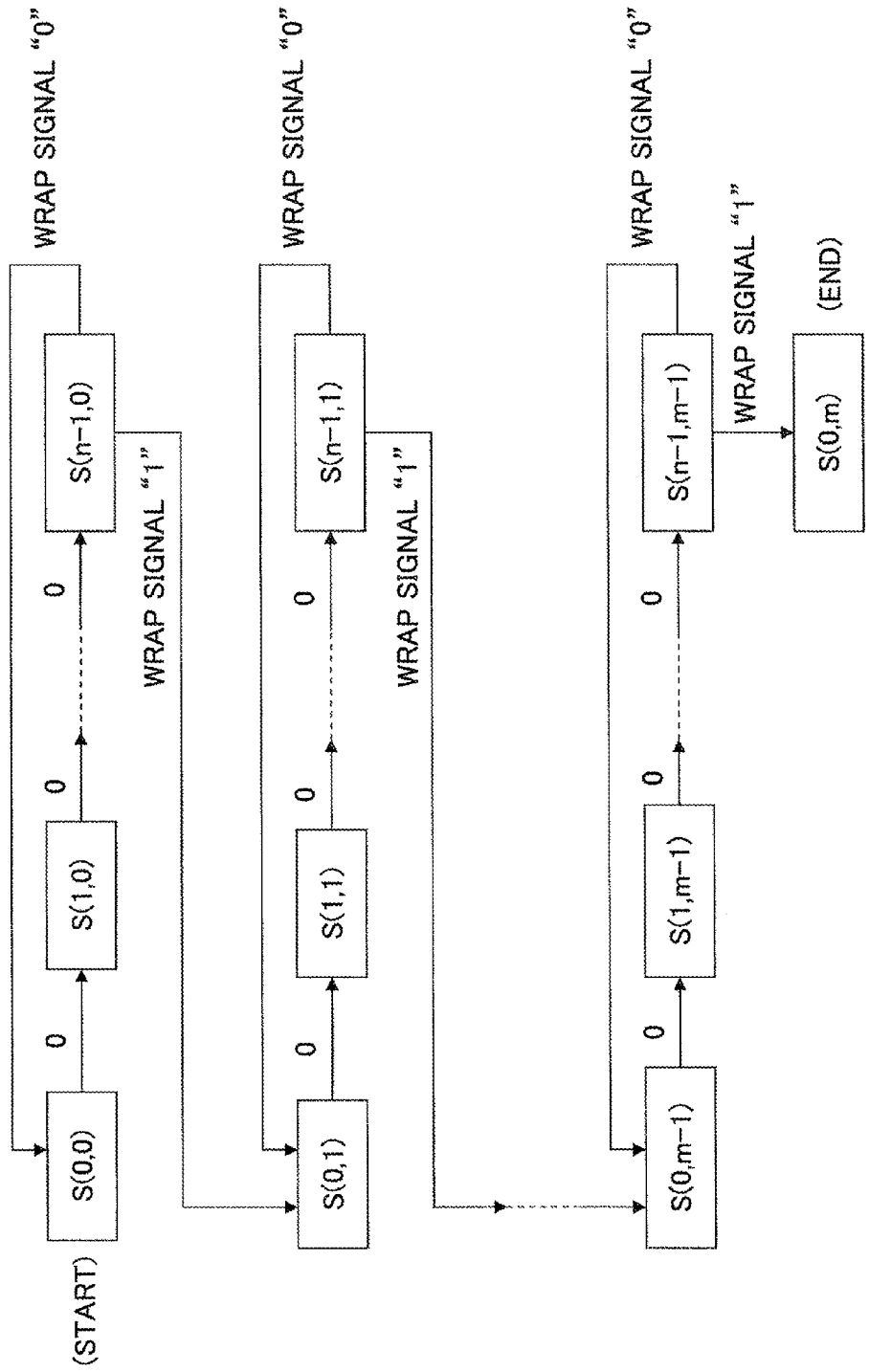
FIG. 10 is a state transition diagram illustrating transitions of a Node number and a parameter k when the phase of the clock signal CKB is changed by a phase selection circuit 30 of the semiconductor circuit device 200 according to the second embodiment.

Next, with reference to a state transition diagram FIG. 10, a state transition of the Node number and the value of the parameter k when the phase of the clock signal CKB is changed by the phase selection circuit 30 of the semiconductor circuit device 200 according to the second embodiment.

FIG. 10 is a state transition diagram illustrating transitions of a Node number and a parameter k when the phase of the clock signal CKB is changed by the phase selection circuit 30 of the semiconductor circuit device 200 according to the second embodiment.

In FIG. 10, the state transition is expressed in S(Node number, value of parameter k).

The cycles of the clock signals CKA, CKA1, CKA2, . . . , CKAn−1 are reduced (i.e., the phases thereof are advanced) based on the formulas (0×k) times, (1×k) times, (2×k) times, . . . , and ((n−1)×k) times of the unit time in the phase control circuits $20_2$, $20_2$, . . . , and $20_{n-1}$, respectively, while the value of the parameter value is sequentially increased from 0 to m−1.

As described above, no phase control circuit is inserted in Node 0, but the phase control circuits $20_2$, $20_2$, . . . , and $20_{n-1}$ are inserted in Node 1 through Node n−1, respectively. The phases of the clock signals CKA, CKA1, CKA2, . . . , CKAn−1 output by the phase control circuits $20_2$, $20_2$, . . . , and $20_{n-1}$ are advanced by the (0×k) times, (1×k) times, (2×k) times, . . . , and ((n−1)×k) times of the unit time, respectively.

In accordance with the state transition of FIG. 10, the phase selection circuit 30 sequentially selects the signal lines of Node 0 through Node n−1, and advances the phase of the clock signal CKB by using the parameter k whose value is increased by one whenever a Hi-level wrap signal is input.

The phase selection circuit 30 starts generating the clock signal CKB from S(0, 0) (START).

The state S(0, 0) denotes a state of Node 0 and parameter k=0. Namely, the phase selection circuit 30 selects the signal line of Node 0, and sets the High-level pulse of the clock signal CKA input into the phase selection circuit 30 via the signal line of Node 0 to the first pulse of the clock signal CKB. Namely, in state S(0, 0), the phase of the clock signal CKB output from the phase selection circuit 30 is the same as the phase of the clock signal CKA input into the phase selection circuit 30.

Next, in state S(1, 0), the phase selection circuit 30 selects the signal line of Node 1, and sets the High-level pulse of the clock signal CKA1 input into the phase selection circuit 30 from the phase control circuit $20_1$ via the signal line of Node 1 to the second pulse of the clock signal CKB.

In this case, the Node number is "1" but the value of the parameter k is "0". Therefore, according to the formula described above, a reduced time period is "0". Therefore, in state S(1, 0), the phase of the clock signal CKB output from the phase selection circuit 30 is the same as the phase of the clock signal CKA input into the phase selection circuit 30.

After that, until the state (n−1, 0), even when the Node number is increased, the value of the parameter k is "0". Therefore, according to the formula described above, the reduced time period is "0". Further, in states S(2, 0) through S(n−1, 0), the phase of the clock signal CKB output from the phase selection circuit 30 is the same as the phase of the clock signal CKA input into the phase selection circuit 30.

Namely, during the states S(0, 0) through S(n−1, 0), the phase of the clock signal CKB output from the phase selection circuit 30 is the same as the phase of the clock signal CKA input into the phase selection circuit 30. In other words, the clock signal CKB phase is not advanced with respect to that of the clock signal CKA.

An object of this is to check the operations of the target circuit 14 with respect to the clock signal CKB whose phase is the same as the phase of the clock signal CKA.

In state S(n−1, 0), when no High-level ("1") wrap signal is input, the phase selection circuit 30 returns the state back to state S(0, 0), and generates the clock signal CKB corresponding to the states S(0, 0) through S(n−1, 0).

In the states changing from S(0, 0) to S(n−1, 0) are repeated until the High-level wrap signal is input. This may correspond to the state where the clock signal CKB having n cycles is repeated in the first embodiment (see part (B) FIG. 4).

Here, for example, when assuming that n=4, the target circuit 14 has 2 kw (kilo words), and the address length N=12, the states S(0, 0) through S(n−1, 0) are repeated (2×1024×12)/4=6144 times until the wrap signal is raised to High level ("1").

As illustrated in part (C) of FIG. 4 in the first embodiment, the wrap signal is raised to High level ("1") whenever each of the test patterns 0 through m−1 ends.

Next, when the value of the parameter k is "1", the phase selection circuit 30 generates the clock signal CKB in the states S(0, 1) through S(n−1, 1).

In state S(0, 1), the phase selection circuit 30 sets the High-level pulse of the clock signal CKA input into the phase selection circuit 30 to the first pulse of the clock signal CKB. Namely, in state S(0, 1), the phase of the clock signal CKB output from the phase selection circuit 30 is the same as the phase of the clock signal CKA input into the phase selection circuit 30.

Next, in state S(1, 1), the phase selection circuit 30 selects the signal line of Node 1, and sets the High-level pulse of the clock signal CKA1 input into the phase selection circuit 30 from the phase control circuit $20_1$ via the signal line of Node 1 to the pulse of the clock signal CKB.

In this case, the Node number is "1" and the value of the parameter k is "1". Therefore, according to the formula described above, the reduced time period is given as (unit time)×1. Therefore, in state S(1, 1), the phase of the clock signal CKB output from the phase selection circuit 30 is advanced with respect to the phase of the clock signal CKA input into the phase selection circuit 30 by (unit time)×1.

After that, when assuming that, while the value of the parameter k is "1", the Node number is increased in the states from S(2, 1) to S(n−1, 1), based on the formulas described above, the time periods are sequentially reduced by the (unit time)×1, (unit time)×2, . . . , (unit time)×(n−1).

Namely, in the states from S(2, 1) to S(n−1, 1), the phases of the clock signal CKB output from the phase selection circuit 30 are sequentially advanced by the (unit time)×2, . . . , (unit time)×(n−1) with respect to the phase of the clock signal CKA input into the phase selection circuit 30.

In the state S(n−1, 1), when no High-level ("1") wrap signal is input, the phase selection circuit 30 returns the state back to state S(0, 1), and generates the clock signal CKB corresponding to the states S(0, 1) through S(n−1, 1).

The states S(0, 1) through S(n−1, 1) are repeated until the High-level ("1") wrap signal is input.

After that, the value of the parameter value is increased one by one from "2". When the value of the parameter value is equal to m−1 corresponding to the number of the last test pattern, the phase selection circuit 30 sets the High-level pulse of the clock signal CKA input into the phase selection circuit 30 via the signal line of Node 0 to the first pulse of the clock signal CKB. Namely, in state S(0, m−1), the phase of the clock signal CKB output from the phase selection circuit 30 is the same as the phase of the clock signal CKA input into the phase selection circuit Next, in state S(1, m−1), the phase selection circuit 30 selects the signal line of Node 1, and sets the High-level pulse of the clock signal CKA1 input into the phase selection circuit 30 from the phase control circuit $20_1$ via the signal line of Node 1 to the first pulse of the clock signal CKB.

In this case, the Node number is "1" and the value of the parameter k is "m−1". Therefore, according to the formula described above, the reduced time period is give as (unit time)×(m−1). Therefore, in state S(1 μm−1), the phase of the clock signal CKB output from the phase selection circuit 30 is advanced with respect to the phase of the clock signal CKA input into the phase selection circuit 30 by (unit time)×(m−1).

After that, when assuming that, while the value of the parameter k is "m−1", the Node number is increased in the states from S(2, m−1) to S(n−1, m−1), based on the formulas described above, the time periods are sequentially reduced by the (unit time)×2×(m−1), . . . , (unit time)×(n−1)×(m−1).

Namely, in the states from S(2, m−1) to S(n−1, m−1), the phases of the clock signal CKB output from the phase selection circuit 30 are sequentially advanced by the (unit time)×2×(m−1), . . . , (unit time)×(n−1)×(m−1) with respect to the phase of the clock signal CKA input into the phase selection circuit 30.

In the state S(n−1, m−1), when no High-level ("1") wrap signal is input, the phase selection circuit 30 returns the state back to state S(0, m−1), and generates the clock signal CKB corresponding to the states S(0, m−1) through S(n−1, m−1).

The states S(0, m−1) through S(n−1, m−1) are repeated until the High-level ("1") wrap signal is input.

In the state S(n−1, m−1), when the High-level ("1") wrap signal is input, the value of the parameter k is increased by one to m. When the value of the parameter k is m, the process of changing the frequency of the clock signal CKB is terminated (END).

Figure 11A:
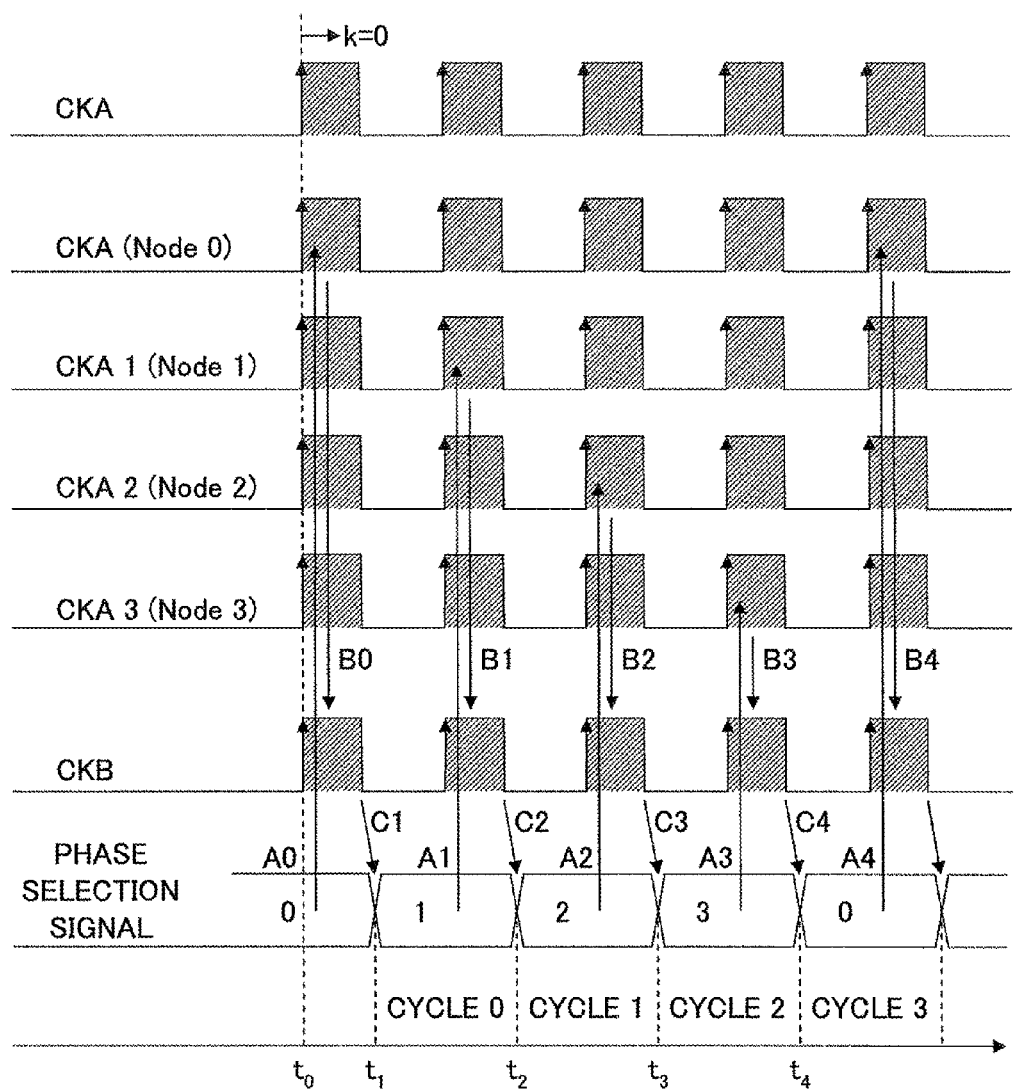
FIG. 11A is a timing chart when the clock signal CKB is generated by sequentially selecting signal lines from Node 0 to Node n−1 in the phase selection circuit 30 of the semiconductor circuit device 200 according to the second embodiment.
Figure 11B:
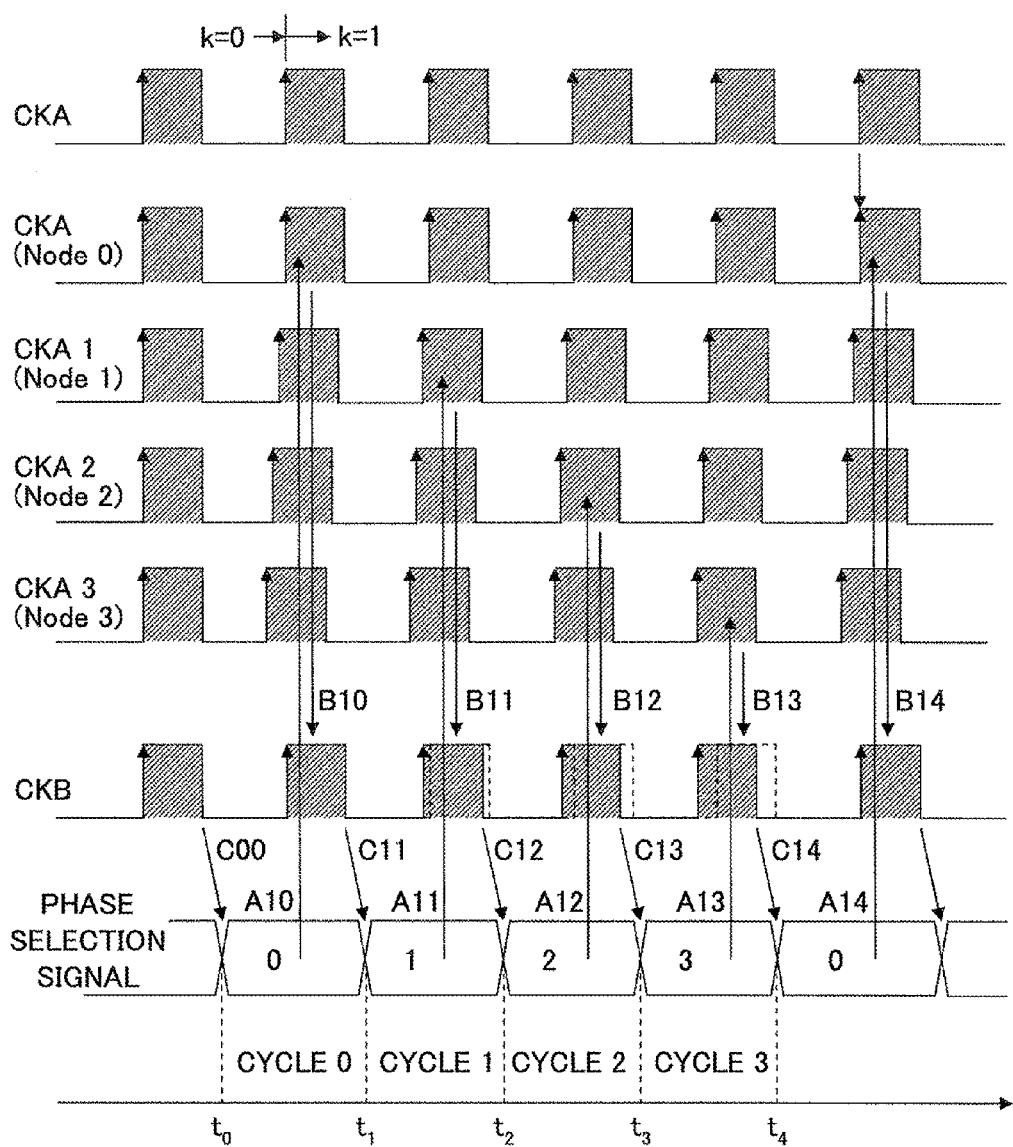
FIG. 11B is another timing chart when the clock signal CKB is generated by sequentially selecting signal lines from Node 0 to Node n−1 in the phase selection circuit 30 of the semiconductor circuit device 200 according to the second embodiment.

Next, with reference to FIGS. 11A and 11B, timing charts are described when the signal clock CKB is generated by sequentially selecting the signal lines from Node 0 to Node n−1 in the phase selection circuit 30 included in the cycle sweep circuit 211 of the semiconductor circuit device 200 according to the second embodiment.

FIGS. 11A and 11B are time charts illustrating the timings when the signal clock CKB is generated by sequentially selecting the signal lines from Node 0 to Node n−1 in the phase selection circuit 30 of the semiconductor circuit device 200 according to the second embodiment. More specifically, FIG. 11A is the timing chart illustrates a case where the value of the parameter k is zero and FIG. 11B illustrates a case where the value of the parameter k is one.

Further, in FIGS. 11A and 11B, for explanatory purposes, it is assumed that the value of n is set to four. Therefore, Node n−1 is set to Node 3. Accordingly, it is also assumed that the phase control circuits $20_1$, $20_2$, and $20_3$ are inserted in the signals lines of Node 1, Node 2, and Node 3, respectively.

FIGS. 11A and 11B illustrate the values of the clock signal CKA output from the PLL 12, the clock signals CKA, CKA1, CKA2, and CKA3 to be input into the phase selection circuit 30 via Node 0, Node 1, Node 2, and Node 3, respectively, the clock signal CKB output from the phase selection circuit 30, and the phase control signal stored in the phase selection counter 241.

Here, the symbols CKA(Node 0), CKA1(Node 1), CKA2 (Node 2), and CKA3(Node 3) denote the clocks to be input into the phase selection circuit 30 via Node 0, Node 1, Node 2, and Node 3, respectively.

As described above, the value of the phase control signal stored in the phase selection counter 241 corresponds to the Node number indicated by the phase control signal. The Node number indicated by the phase control signal sequentially changes in the order of 0, 1, 2, and 3 every one cycle of the clock signal CKB.

Further, FIG. 11A illustrates the timing chart when the value of the parameter k is "0". In the phase control circuits $20_1$, $20_2$, and $20_3$ corresponding to Node 1, Node 2, and Node 3, the phases of the clock signals CKA(Node 0), CKA1(Node 1), CKA2(Node 2), and CKA3 (Node 3) do not change.

Therefore, those clock signals CKA(Node 0), CKA1 (Node 1), CKA2 (Node 2), and CKA3 (Node 3) output from the PLL 12 have the same phase.

At time t0, the value of the phase selection signal is "0". Therefore, the phase selection circuit 30 selects the High-level pulse of the clock signal CKA(Node 0) as illustrated in arrow A0, and acquires (reads) the High-level pulse of the clock signal CKA(Node 0) as the clock signal CKB as illustrated in arrow B0.

As a result, the phase of the High-level pulse in cycle 0 of the clock signal CKB is the same as the phase of the Hi-level pulse of the clock signal CKA(Node 0).

Next, at time t1, the clock CKB is raised so that the value of the phase selection signal is "1" as illustrated by arrow C1.

By doing this, the phase selection circuit 30 selects the High-level pulse of the clock signal CKA1(Node 1) as illustrated by arrow A1, and acquires (reads) the High-level pulse of the clock signal CKA1(Node 1) as the clock signal CKB as illustrated in arrow B1.

As a result, the phase of the High-level pulse in cycle 1 of the clock signal CKB is the same as the phase of the Hi-level pulse of the clock signal CKA1 (Node 1).

Next, at time t2, the clock CKB is raised so that the value of the phase selection signal is "2" as illustrated by arrow C2.

By doing this, the phase selection circuit 30 selects the High-level pulse of the clock signal CKA2(Node 2) as illustrated by arrow A2, and acquires (reads) the High-level pulse of the clock signal CKA2(Node 2) as the clock signal CKB as illustrated in arrow B2.

As a result, the phase of the High-level pulse in cycle 2 of the clock signal CKB is the same as the phase of the Hi-level pulse of the clock signal CKA2 (Node 2).

Next, at time t3, the clock CKB is raised so that the value of the phase selection signal is "3" as illustrated by arrow C3.

By doing this, the phase selection circuit 30 selects the High-level pulse of the clock signal CKA3(Node 3) as illustrated by arrow A3, and acquires (reads) the High-level pulse of the clock signal CKA3(Node 3) as the clock signal CKB as illustrated in arrow B3.

As a result, the phase of the High-level pulse in cycle 3 of the clock signal CKB is the same as the phase of the Hi-level pulse of the clock signal CKA3 (Node 3).

Next, at time t4, the clock CKB has fallen so that the value of the phase selection signal is "0" as illustrated by arrow C4.

By doing this, the phase selection circuit 30 selects the High-level pulse of the clock signal CKA(Node 0) as illustrated by arrow A4, and acquires (reads) the High-level pulse of the clock signal CKA(Node 0) as the clock signal CKB as illustrated in arrow B4.

As a result, the phase of the High-level pulse in cycle 4 of the clock signal CKB is the same as the phase of the Hi-level pulse of the clock signal CKA4 (Node 4).

After that, similar to the above, the phase selection circuit 30 sequentially acquires the High-level pulses of the clock signals CKA(Node 0), CKA1 (Node 1), CKA2 (Node 2), and CKA3 (Node 3), so as to generate the clock signal CKB.

Next, with reference to FIG. 11B, the timing chart when the value of the parameter k is "1" is described.

In FIG. 11B, the value of the parameter k is "1". Therefore, the phases of the clock signals CKA1 (Node 1), CKA2 (Node 2), and CKA3 (Node 3) are advanced with respect to the phase of the clock signal CKA(Node 0) by (unit time)×1, (unit time)×2, and (unit time)×3, respectively.

At time t0, it is assumed that the value of the phase selection signal is "0" in response to the rising of the clock signal CKB as illustrated by arrow C00. Further, it is also assumed that the BIST using the test pattern 0 is terminated and the value of the parameter k is increased from "0" to "1".

The value of the phase selection signal is "0". Therefore, the phase selection circuit 30 selects the High-level pulse of the clock signal CKA(Node 0) as illustrated by arrow A10, and acquires (reads) the High-level pulse of the clock signal CKA(Node 0) as the clock signal CKB as illustrated in arrow B10.

As a result, the phase of the High-level pulse in cycle 0 of the clock signal CKB is the same as the phase of the Hi-level pulse of the clock signal CKA(Node 0).

Next, at time t1, the clock CKB is raised so that the value of the phase selection signal is "1" as illustrated by arrow C11.

By doing this, the phase selection circuit 30 selects the High-level pulse of the clock signal CKA1(Node 1) as illustrated by arrow A11, and acquires (reads) the High-level pulse of the clock signal CKA1(Node 1) as the clock signal CKB as illustrated in arrow B11.

As a result, the phase of the High-level pulse in cycle 1 of the clock signal CKB is the same as the phase of the Hi-level pulse of the clock signal CKA1 (Node 1).

The phase of the High-level pulse of the clock signal CKA1 (Node 1) is advanced with respect to the phase of the clock signal CKA(Node 0) by (unit time)×1. Therefore, the phase of the High-level pulse of the clock signal CKB in cycle 1 is advanced with respect to the phase of the clock signal CKA (Node 0) by (unit time)×1.

Namely, in cycle 1, the phase of the clock signal CKB is advanced with respect to the phase of the clock signal CKA (Node 0) by (unit time)×1.

Next, at time t2, the clock CKB is raised so that the value of the phase selection signal is "2" as illustrated by arrow C12.

By doing this, the phase selection circuit 30 selects the High-level pulse of the clock signal CKA2(Node 2) as illustrated by arrow A12, and acquires (reads) the High-level pulse of the clock signal CKA2(Node 2) as the clock signal CKB as illustrated in arrow B12.

As a result, the phase of the High-level pulse in cycle 2 of the clock signal CKB is the same as the phase of the Hi-level pulse of the clock signal CKA2 (Node 2).

The phase of the High-level pulse of the clock signal CKA2 (Node 2) is advanced with respect to the phase of the clock signal CKA(Node 0) by (unit time)×2. Therefore, the phase of the High-level pulse of the clock signal CKB in cycle 2 is advanced with respect to the phase of the clock signal CKA (Node 0) by (unit time)×2.

Namely, in cycle 2, the phase of the clock signal CKB is advanced with respect to the phase of the clock signal CKA (Node 0) by (unit time)×2.

Next, at time t3, the clock CKB is raised so that the value of the phase selection signal is "3" as illustrated by arrow C13.

By doing this, the phase selection circuit 30 selects the High-level pulse of the clock signal CKA3(Node 3) as illustrated by arrow A13, and acquires (reads) the High-level pulse of the clock signal CKA3(Node 3) as the clock signal CKB as illustrated in arrow B13.

As a result, the phase of the High-level pulse in cycle 3 of the clock signal CKB is the same as the phase of the Hi-level pulse of the clock signal CKA3 (Node 3).

The phase of the High-level pulse of the clock signal CKA3 (Node 3) is advanced with respect to the phase of the clock signal CKA(Node 0) by (unit time)×3. Therefore, the phase of the High-level pulse of the clock signal CKB in cycle 3 is advanced with respect to the phase of the clock signal CKA (Node 0) by (unit time)×3.

Namely, in cycle 3, the phase of the clock signal CKB is advanced with respect to the phase of the clock signal CKA (Node 0) by (unit time)×3.

Next, at time t4, the clock CKB has fallen so that the value of the phase selection signal is "0" as illustrated by arrow C14.

By doing this, the phase selection circuit 30 selects the High-level pulse of the clock signal CKA(Node 0) as illustrated by arrow A14, and acquires (reads) the High-level pulse of the clock signal CKA(Node 0) as the clock signal CKB as illustrated in arrow B14.

As a result, the phase of the High-level pulse in cycle 4 of the clock signal CKB is the same as the phase of the Hi-level pulse of the clock signal CKA(Node 0).

After that, similar to the above, the phase selection circuit 30 sequentially acquires the High-level pulses of the clock signals CKA(Node 0), CKA1 (Node 1), CKA2 (Node 2), and CKA3 (Node 3), so as to generate the clock signal CKB having the phase that is advanced sequentially and repeatedly.

Further, the clock signal CKB to be acquired (generated) as described above sequentially acquires the High-level pulses whose phases are sequentially advanced by the unit time, so that the cycle 1, cycle 2, cycle 3 are the same cycle but the cycle 0 is longer than cycle 1, cycle 2, and cycle 3 by the unit time.

Further, when the value of the parameter k is "2" or more, the phases of the clock signals CKA1(Node 1), CKA2(Node 2), and CKA3(Node 3) are advanced with respect to the phase of the clock signal CKA(Node 0) by (unit time)×1×k, (unit time)×2×k, and (unit time)×3×k, respectively.

Therefore, the only difference is that the time period corresponding the phase to be advanced in the clock signals CKA, CKA1(Node 1), CKA2(Node 2), and CKA3(Node 3) is multiplied by k. The method of generating the clock signal CKB is the same as that in a case where the value of the parameter k is "1" illustrated in FIG. 11B.

As described above, the phase selection circuit 30 generates the clock signal CKB whose phase is periodically advanced.

Figure 12:
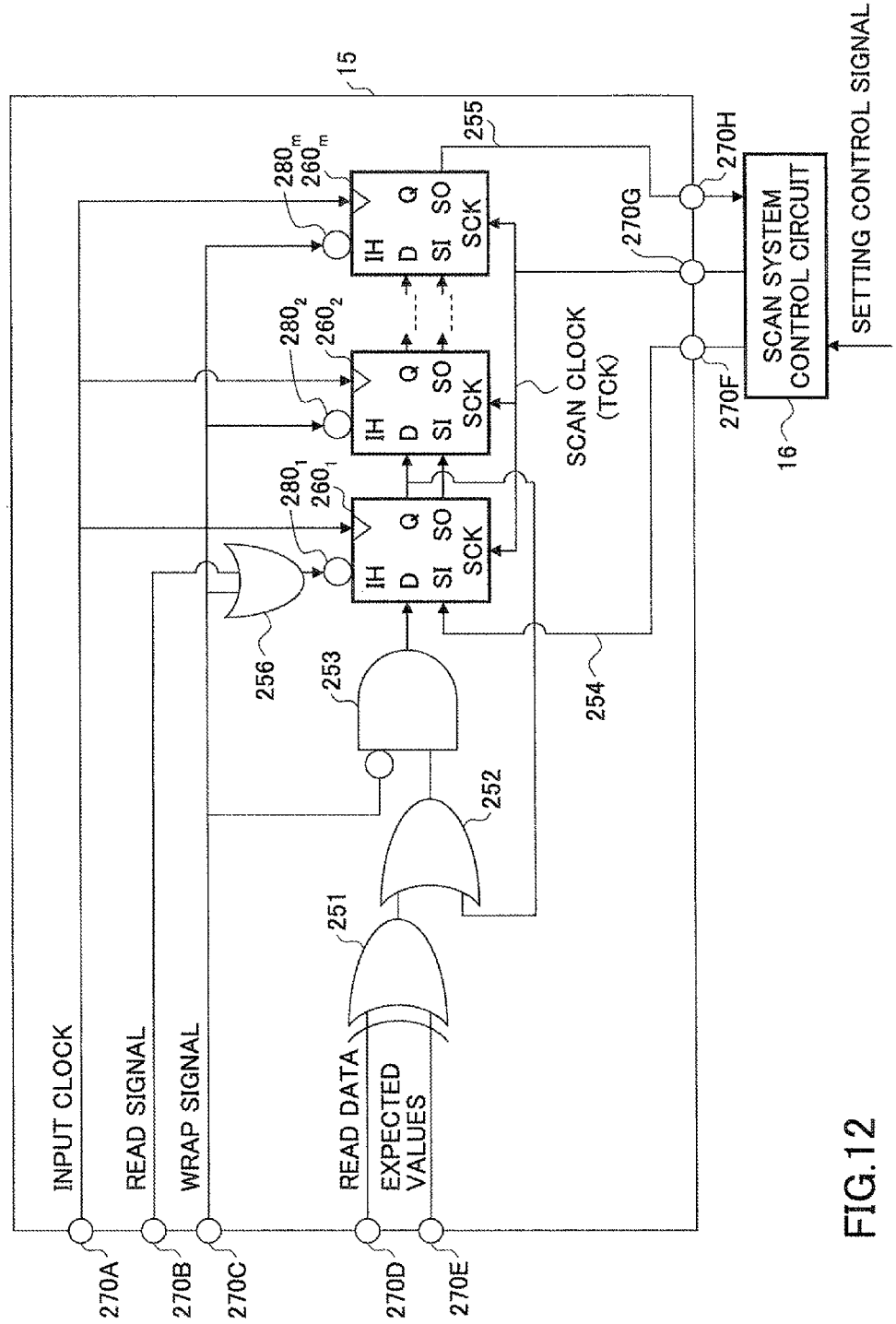
FIG. 12 is a drawing illustrating a test result memory circuit 15 of the semiconductor circuit device 200 according to the second embodiment.

Next, with reference to FIG. 12, a circuit configuration of the test result memory circuit 15 is described.

FIG. 12 illustrates a test result memory circuit 15 of the semiconductor circuit device 200 according to the second embodiment.

The test result memory circuit 15 of the semiconductor circuit device 200 includes an exclusive OR (EOR) circuit 251, an OR circuit 252, an AND circuit 253, a scan-in chain 254, a scan-out chain 255, an OR circuit 256, and m scan Flip Flops (FF) $260_1, 260_2, \ldots,$ and $260_m$.

The test result memory circuit 15 further includes a clock signal input terminal 270A, a READ signal input terminal 270B, a wrap signal input terminal 270C, a READ data input terminal 270D, an expected value input terminal 270E, a scan-in terminal 270F, a scan-lock input terminal 270G, and a scan-out terminal 270H.

The EOR circuit 251 outputs an Exclusive OR between the READ data input via the READ data input terminal 270D and the expected value input via the expected value input terminal 270E. As long as the target circuit 14 operates normally, the READ data is the same as the expected value ("0" or "1"). Therefore, the EOR circuit 251 outputs "0" when the READ data corresponds to the expected value, and outputs "1" when the READ data does not correspond to the expected value.

The OR circuit 252 inputs the output of the EOR circuit 251 (to one input terminal thereof) and an output (Q) of the scan FF $260_1$ (to the other input terminal thereof).

The AND circuit 253 inputs an inverted wrap signal via the wrap signal input terminal 270C (to one input terminal thereof) and the output of the OR circuit 252 (to the other input terminal thereof). The output terminal of the AND circuit 253 is connected to the input terminal (D) of the scan FF $260_1$.

The output value of the AND circuit 253 varies depending on the test result of the comparison between the READ data and the expected value in the EOR circuit 251, and, therefore, indicates the BIST test result.

Further, the output value of the AND circuit 253 is reset when the wrap signal, whose inverted input is input into one input terminal of the AND circuit 253, is set to H level ("1"). Namely, the output of the AND circuit 253 is reset to "0" when the test pattern is switched (changed) (because, in this case, the wrap signal is set to "1").

The output values of the AND circuit 253 are sequentially stored into the output terminals (Q) of the scan FFs $260_1, 260_2, \ldots,$ and $260_n$ as the values indicating the BIST test results.

The scan-in chain 254 is a scan-test signal line connecting the scan-in terminal 270F and Scan In terminal SI (Scan In) of the scan FF $260_1$.

The scan-out chain 255 is a scan-test signal line connecting the scan-out terminal 270H and Scan Out terminal SO (Scan Out) of the scan FF $260_m$.

The OR circuit 256 outputs the logical sum between the READ signal and the wrap signal. The output of the OR circuit 256 is inverted and input to the InHibit (IH) terminal of the scan FF $260_1$.

Each of the scan FFs $260_1, 260_2, \ldots,$ and $260_m$ includes the input terminal D, the output terminal Q, the scan-in terminal SI (Scan In), the scan-out terminal SO (Scan Out), the IH (InHibit) terminal, a clock input terminal, and a scan clock input terminal SCK. The IH terminals of the scan FFs $260_1, 260_2, \ldots,$ and $260_m$ are connected to respective NOT operators $280_1, 280_2, \ldots,$ and $280_m$.

The scan FFs $260_1, 260_2, \ldots,$ and $260_m$ constitute an m-bit register by mutually connecting the input terminal D and the output terminal Q, and also mutually connecting the scan-in terminal SI and the scan-out terminal SO between adjacent scan FFs as illustrated in FIG. 12. The scan FFs $260_1, 260_2, \ldots,$ and $260_m$ are provided to store BIST results using m test patterns.

The input terminal (D) of the scan FF $260_1$ is connected to the output terminal of the AND circuit 253. The scan-in terminal SI of the scan FF $260_1$ is connected to the scan-in chain 254. The IH terminal of the scan FF $260_1$ is connected to the output terminal of the OR circuit 256 via the NOT operator $280_1$.

The IH terminals of the scan FFs $260_2, \ldots,$ and $260_m$ are connected to the wrap signal input terminal 270C via the respective NOT operators $280_2, \ldots,$ and $280_m$.

The scan-out terminal SO of the scan FF $260_n$ is connected to the scan-out chain 255.

Further, the clock input terminals of the scan FFs $260_1, 260_2, \ldots,$ and $260_m$ are connected to the clock signal input terminal 270A. Further, the scan clock input terminals SCK of the scan FFs $260_1, 260_2, \ldots,$ and $260_m$ are connected to the scan-lock input terminal 270G.

The clock signal input terminal 270A is the terminal to input the clock signal CKB to the clock input terminals of the scan FFs $260_1, 260_2, \ldots,$ and $260_m$.

The READ signal input terminal 270B is the terminal to input the READ signal into the test result memory circuit 15.

The wrap signal input terminal 270C is the terminal to input the wrap signal into the test result memory circuit 15.

The READ data input terminal 270D is the terminal to input the READ data from the target circuit 14 into the EOR circuit 251 of the test result memory circuit 15.

The expected value input terminal 270E is the terminal to input the expected values from the test pattern generation circuit 13 into the EOR circuit 251 of the test result memory circuit 15.

The scan-in terminal 270F is the terminal to input scan-in data from the scan system control circuit 16 into the scan FFs $260_1, 260_2, \ldots,$ and $260_m$ via the scan-in chain 254.

The scan-lock input terminal 270G is the terminal to input the scan clock TCK into the scan clock input terminals SCK of the scan FFs $260_1, 260_2, \ldots,$ and $260_m$. The scan clock TCK is used for scan-in/scan-out of the test data.

The scan-out terminal 270H is the terminal to output the test results of the target circuit 14 from the scan FFs $260_1, 260_2, \ldots,$ and $260_n$ via the scan-out chain 255.

In the test result memory circuit 15 as illustrated in FIG. 12, the scan FFs $260_1, 260_2, \ldots,$ and $260_m$ operate based on the clock signal CKB input to the respective clock input terminals.

The scan FFs $260_1, 260_2, \ldots,$ and $260_m$ switch inhibit/permit reading data based on the input to the respective IH terminals.

Here, the READ signal is the signal to control the operation of the scan FF $260_1$ to read the BIST test results.

When the READ signal is "1", the value "0" is input into the IH terminal of the scan FF $260_1$. Therefore, the reading is permitted, so that the scan FF $260_1$ reads the BIST test results.

On the other hand, when the READ signal is "0", the value "1" is input into the IH terminal of the scan FF $260_1$. Therefore, the reading is inhibited.

Further, the wrap signal is the signal that is set to H level ("1") when the test pattern is switched. Therefore, the wrap signal is set to L level ("0") while the BIST is performed using the test pattern. Therefore, while the BIST is performed, the value "1" is input into the IH terminals of the scan FFs $260_1, 260_2, \ldots,$ and $260_m$, so that the writing to the scan FFs $260_1, 260_2, \ldots,$ and $260_m$ is inhibited.

On the other hand, the wrap signal is set to H level ("1") when the test pattern is switched. In this case, the value "0" is input into the IH terminals of the scan FFs $260_1, 260_2, \ldots,$ and $260_m$, so that writing into the scan FFs $260_1, 260_2, \ldots,$ and $260_n$ is permitted. Under this state that writing is permitted, the test results are sequentially written into the scan FFs $260_1, 260_2, \ldots,$ and $260_m$.

As described above, in the test result memory circuit 15 according to the second embodiment, when the READ data correspond to (are the same values of) the expected values, the output of the EOR circuit 251 is "0".

Further, as long as the READ data correspond to the expected values, the output value of the scan FF $260_1$ is "0", and both of the input values to the OR circuit 252 are "0". Therefore, the output of the OR circuit 252 is "0".

Further, the wrap signal is set to H level ("1") only when the test pattern is switched, but is maintained to "0" during the performance of the BIST using any of the test patterns 0 through m−1. The wrap signal is inverted and input into the AND circuit 253.

Therefore, in a case where the READ data correspond to the expected values and while the wrap signal is set to L level ("0") under performance of the BIST using any of the test patterns 0 through m−1, the AND circuit 253 inputs "1" (as inverted wrap signal) and "0" (as the output of OR circuit 252). Therefore the output of the AND circuit 253 is "0".

Whenever the test patterns 0 though m−1 are switched, the output of the AND circuit 253 is sequentially written into the scan FFs $260_1, 260_2, \ldots,$ and $260_m$.

On the other hand, in the EOR circuit 251, when the READ data do not correspond to the expected value, the output value of the EOR circuit 251 is "1".

Further, during the performance of the BIST, the wrap signal is L level ("0"). The wrap signal is inverted and input into the AND circuit 253. Therefore, once the READ data do not correspond to the expected value, the output value "1" of the AND circuit 253 is maintained in the output terminal (Q) of the scan FF $260_1$.

The value of the output terminal (Q) of the scan FF $260_1$ is input into one of the input terminals of the OR circuit 252. If the wrap signal is not set to H level ("1"), the value of the output terminal (Q) of the scan FF $260_1$ is never reset.

Therefore, after the READ data do not correspond to the expected value, even if the READ data correspond to the expected value in the same test pattern, so that the output value of the EOR circuit 251 is returned to "0", the output of the OR circuit 252 is maintained and fixed to "1".

As a result, even if there is only one READ data that do not correspond to the expected value in one test pattern, the value "1" (indicating that there are no matched data) is stored (maintained) in the output of the OR circuit 252.

Therefore, when m test results that are sequentially acquired by performing the BIST using the test patterns 0 through m−1 within one process are sequentially stored into the scan FFs $260_1$, $260_2$, ..., and $260_m$, it may become possible to acquire the frequency characteristics of a Shmoo Plot under a single power voltage and a single temperature environment.

To read the data (TDO) indicating m test results stored in the scan FFs $260_1$, $260_2$, ..., and $260_m$, the scan system control circuit 16 of the LSI tester 300 (see FIG. 5) selects the scan-in chain 254 and the scan-out chain 255 using the scan control signals (TCK, TMS).

Then, by sequentially acquiring (reading) the data (TDO) stored in the scan FFs $260_1$, $260_2$, ..., and $260_m$ using the scan clock (TCK), the LSI tester 300 may acquire (generates) the corresponding frequency characteristics of the Shmoo Plot.

As described above, in the semiconductor circuit device 200 according to the second embodiment, as illustrated in FIGS. 11A and 11B, by using the clock signal CKB whose cycle is reduced (frequency is increased) by gradually advancing the phases thereof, it may become possible to sequentially perform the BIST with respect to various frequencies within a single process.

As described with reference to the state transition of FIG. 10, the cycle of the clock signal CKB may be gradually reduced from the case where k=0 to the case where K=m−1. Then, when the cycle is most reduced, the cycle is reduced by (unit time)×(n−1)×(m−1) with respect to the timing when the High-level pulse of Node 0 is raised.

Therefore, according to an embodiment, by setting the frequency, values of m and m and the unit time to cover all the frequency characteristics of the Shmoo Plot of the semiconductor circuit device 200, it may become possible to acquire the frequency characteristics of the Shmoo Plot by performing a single sequential BIST.

By doing this, it may become possible to greatly reduce the time to prepare (generate) the Shmoo Plot of the semiconductor circuit device.

As described above, according to the second embodiment, by making it possible to change the frequency of the clock signal for BIST, it may become possible to provide a semiconductor circuit device capable of greatly reducing the test time.

Further, in the above descriptions, a case is described where the target circuit 14 is an SRAM. However, the target circuit 14 may be other kind of RAMs.

Further, in the above description, an embodiment of RAM-BIST using a RAM is described. However, the semiconductor circuit device 200 may be applied to the logical BIST in which an operand (value to be calculated) is input to a computing unit and the calculation result is compared with the expected value.

When the semiconductor circuit device 200 is applied to the logical BIST, the test pattern generation part may generate test patterns for a logic circuit such as the computing unit rather than an SRAM.

In the above description, a circuit device, a frequency changing circuit, a method of testing the circuit device, and a method of controlling the frequency changing circuit according to embodiments are described. However, the present invention is not limited to the embodiments specifically disclosed. A person skilled in the art may easily achieve various modification and changes without departing from the scope of the present invention.

The other objects, features, and benefits of the present application may become further clear by referring to the accompanying drawing and embodiments described above.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiment of the present invention has been described in detail, it should be understood that various changes, substitutions, and alterations could be made hereto without departing from the spirit and scope of the invention.

What is claimed is:

1. A circuit device comprising:
   a clock generator configured to output a clock signal having a first frequency;
   plural phase controllers configured to input the clock signal having the first frequency output by the clock generator, and output respective clock signals having the first frequency and having phases that are advanced or delayed with respect to a phase of the clock signal having the first frequency output by the clock generator;
   a selector configured to input plural clock signals having the first frequency output from the plural phase controllers, sequentially select pulses of the plural clock signals having the first frequency, and output a clock signal having a second frequency;
   a pattern generator configured to generate a test pattern based on the clock signal having the second frequency output from the selector; and
   a circuit configured to input the clock signal having the second frequency output from the selector and the test pattern generated by the pattern generator, operate based on the clock signal having the second frequency, and output operation results of the operations when inputting the test pattern based on the clock signal having the second frequency.

2. The circuit device according to claim 1, further comprising:
   a controller configured to input a control signal output from the pattern generator, and control the selector based on the control signal.

3. The circuit device according to claim 2, wherein the pattern generator is configured to output the control signal after outputting the test pattern to be input into the circuit.

4. The circuit device according to claim 1, further comprising:
   a comparator configured to input the operation results output from the circuit and expected values corresponding to the test pattern to be input into the circuit, and output comparison results which are results of comparing the operation results with the expected values; and
   a comparison result memory circuit configured to store the comparison results output from the comparator.

5. The circuit device according to claim 4, wherein the comparator includes
   an exclusive OR circuit configured to perform an exclusive OR operation between the operation results and the expected values; and
   an OR circuit configured to perform an OR operation between the output from the exclusive OR circuit and the output from the comparison result memory circuit, and output results of the OR operation to the comparison result memory circuit.

6. The circuit device according to claim 5, wherein the comparator further includes
an AND circuit configured to perform an AND operation between results of the OR operation performed between results of the OR operation from the OR circuit and results of a NOT operation performed on the control signal, and output results of the AND operation to the comparison result memory circuit.

7. The circuit device according to claim 2, wherein the controller includes
a selection signal generator configured to output a selection signal to sequentially select the pulses of the plural clock signals having the first frequency based on the clock signal having the second frequency output from the selector, and
plural phase control signal generators configured to output respective phase control signals to control the plural phase controllers based on the input control signal and the clock signal having the first frequency output from the clock generator.

8. A method of testing a circuit device comprising:
outputting, by a clock generator of the circuit device, a clock signal having a first frequency;
inputting, by plural phase controllers of the circuit device, the clock signal having the first frequency output by the clock generator, and outputting, by the plural phase controllers, respective clock signals having the first frequency and having phases that are advanced or delayed with respect to a phase of the clock signal output by the clock generator;
inputting, by a selector of the circuit device, plural clock signals having the first frequency output from the plural phase controllers, sequentially selecting, by the selector, pulses of the plural clock signals having the first frequency, and outputting, by the selector, a clock signal having a second frequency;
generating, by a pattern generator of the circuit device, a test pattern based on the clock signal having the second frequency output from the selector; and
inputting, by a circuit of the circuit device, the clock signal having the second frequency output from the selector and the test pattern generated by the pattern generator, and outputting, by the circuit, operation results of operations when inputting the test pattern based on the clock signal having the second frequency.

9. A method of controlling a frequency changing circuit coupled to a clock generator outputting a first clock signal having a first frequency, comprising:
inputting, by plural phase controllers of the frequency changing circuit, the first clock signal output by the clock generator, and outputting, by the plural phase controllers, respective plural clock signals having the first frequency and having phases that are advanced or delayed with respect to a phase of the first clock signal;
inputting, by a selector of the frequency changing circuit, the first clock signal and the plural clock signals output from the plural phase controllers, sequentially selecting, by the selector, pulses of the plural clock signals having the first frequency, and outputting, by the selector, a second clock signal having a second frequency;
first controlling, by a sequencer of the frequency changing circuit, the plural phase controllers to output the plural clock signals having the first frequency and having mutually different phases, based on respective phase control signals output from the sequencer in response to a wrap signal that indicates an end of a test pattern; and
second controlling, by the sequencer, the selector to sequentially select the pulses of the plural clock signals having the first frequency and output the second clock signal, based on a phase selection signal output from the sequencer in response to the wrap signal.

10. The method according to claim 9, further comprising:
setting, by the sequencer, the phase control signals and the phase selection signal to initial values in response to a setting control signal.

11. The method according to claim 10, further comprising:
supplying, by the sequencer, a step number signal to each of the plural phase controllers in order to set an integer that is used by each of the plural phase controllers in order to shorten a period of the first clock signal by respective multiples of the integer in response to the setting control signal.

12. The method according to claim 11, further comprising:
supplying, by the sequencer, a termination signal to the selector in order to stop generating the second clock signal in response to the setting control signal when a predetermined number of tests are counted.

13. The method according to claim 10, wherein
the first controlling controls, by the sequencer, the plural phase controllers to output the plural clock signals having the first frequency and having mutually different phases, based on respective phase control signals output from the sequencer in response to the wrap signal and the setting control signal, and
the second controlling controls, by the sequencer, the selector to sequentially select the pulses of the plural clock signals having the first frequency and output the second clock signal, based on the phase selection signal output from the sequencer in response to the wrap signal, the setting control signal, and the second clock signal.

14. The method according to claim 9, wherein
the first controlling and the second controlling receives the test pattern from a pattern generator which generates the test pattern in response to the second clock signal, and
the first controlling and the second controlling receives the wrap signal from the pattern generator which generates the wrap signal.

* * * * *